United States Patent
Udagawa

(10) Patent No.: US 7,315,050 B2
(45) Date of Patent: Jan. 1, 2008

(54) SEMICONDUCTOR DEVICE, SEMICONDUCTOR LAYER AND PRODUCTION METHOD THEREOF

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/332,200

(22) PCT Filed: May 23, 2002

(86) PCT No.: PCT/JP02/05007

§ 371 (c)(1),
(2), (4) Date: Jan. 7, 2003

(87) PCT Pub. No.: WO02/097861

PCT Pub. Date: Dec. 5, 2002

(65) Prior Publication Data

US 2003/0234400 A1 Dec. 25, 2003

Related U.S. Application Data

(60) Provisional application No. 60/300,425, filed on Jun. 26, 2001.

(30) Foreign Application Priority Data

May 28, 2001 (JP) .............................. 2001-158282

(51) Int. Cl.
*H01L 33/00* (2006.01)
(52) U.S. Cl. .............................. 257/103; 257/79; 257/94
(58) Field of Classification Search ........... 257/79–103
See application file for complete search history.

(56) References Cited

U.S. PATENT DOCUMENTS

| 4,296,424 | A | | 10/1981 | Shibasaki et al. | |
|---|---|---|---|---|---|
| 5,005,057 | A | * | 4/1991 | Izumiya et al. | ............... 257/13 |
| 5,042,043 | A | | 8/1991 | Hatano et al. | |
| 5,076,860 | A | * | 12/1991 | Ohba et al. | ................ 148/33.1 |
| 5,241,553 | A | * | 8/1993 | Tanaka | ........................ 372/45 |
| 5,536,952 | A | | 7/1996 | Shikata | |
| 5,624,853 | A | | 4/1997 | Shikata | |
| 6,069,021 | A | | 5/2000 | Terashima et al. | |
| 6,541,799 | B2 | * | 4/2003 | Udagawa | ..................... 257/94 |
| 6,734,515 | B1 | | 5/2004 | Tadatomo et al. | |
| 6,809,346 | B2 | * | 10/2004 | Udagawa | ..................... 257/99 |

FOREIGN PATENT DOCUMENTS

| CA | 2092215 | 3/1993 |
|---|---|---|
| DE | 689 19 408 | 9/1989 |
| DE | 693 19 360 | 3/1993 |
| EP | 377940 A2 | 7/1990 |
| EP | 562549 A2 | 9/1993 |

(Continued)

OTHER PUBLICATIONS

CRC Handbook of Chemistry and physics, David R. Lide, 82nd Edition, Chapter 12, p. 101.*

(Continued)

*Primary Examiner*—Wai-Sing Louie
(74) *Attorney, Agent, or Firm*—Sughrue Mion, PLLC

(57) ABSTRACT

A semiconductor device is prepared by the use of a vapor phase method and is provided with a semiconductor layer composed of boron phosphide (BP) having a band gap at room temperature of not less than 2.8 eV and not more than 3.4 eV or a boron phosphide (BP)-base mixed crystal which contains the boron phosphide (BP) and which is represented by the formula: $B_\alpha Al_\beta Ga_\gamma In_{1-\alpha-\beta-\gamma} P_\delta As_\epsilon N_{1-\delta-\epsilon}$ ($0<\alpha\leq 1$, $0\leq\beta<1$, $0\leq\gamma<1$, $0<\alpha+\beta+\gamma\leq 1$, $0<\delta\leq 1$, $0\leq\epsilon<1$, $0<\delta+\epsilon\leq 1$).

6 Claims, 9 Drawing Sheets

FOREIGN PATENT DOCUMENTS

| JP | 54-127292 | 10/1979 |
| JP | 2-275682 | 11/1990 |
| JP | 2-288371 | 11/1990 |
| JP | 2-288388 | 11/1990 |
| JP | 3-34549 | 2/1991 |
| JP | 3-34551 | 2/1991 |
| JP | 4-209584 | 7/1992 |
| JP | 5-275440 | 10/1993 |
| JP | 5-275441 | 10/1993 |
| JP | 5-291277 | 11/1993 |
| JP | 5-291278 | 11/1993 |
| JP | 10-247760 | 9/1998 |
| JP | 10-247761 | 9/1998 |
| JP | 11-266006 | 9/1999 |
| JP | 2000-4046 | 1/2000 |
| JP | 2000-58451 | 2/2000 |
| JP | 2000-101129 | 4/2000 |
| JP | 2000-101130 | 4/2000 |
| JP | 2000-235956 | 8/2000 |

OTHER PUBLICATIONS

V.A. Fomichev, et al., "Investigation of the energy band structure of boron phosphide by ultra-soft x-ray spectroscopy", J. Phys. Chem. Solids, Pergamon Press 1968, vol. 29, pp. 1025-1032.

B. Stone, et al., "Semiconducting Properties of Cubic Boron Phosphide", Physical Review Letters, vol. 4, No. 6, Mar. 15, 1960, pp. 282-284.

R.J. Archer, et al., "Optical absorption, electroluminescence, and the band gap of BP", Physical Review Letters, vol. 12, No. 19, May 11, 1964, pp. 538-540.

Y. Kumashiro, et al., "Crystal Growth of Thick Wafers of Boron Phosphide", Journal of Crystal Growth, vol. 70, 1984, pp. 507-514.

T.L. Chu, "Crystals and epitaxial layers of Boron Phosphide", Journal of Applied Physics, vol. 42, No. 1, Jan. 1971, pp. 420-424.

F.M. Ryan, et al., "Photoluminescence and Pair Spectrum in Boron Phosphide", Physical Review, vol. 148, No. 2, Aug. 12, 1966, pp. 858-862.

Renata M. Wentzcovitch et al., "Electronic and Structural Properties of BN and BP", Physical Review B, The American Physical Society, Jul. 15, 1986, pp. 1071-1079, Physical Review B, vol. 34, No. 2.

M. Ferhat et al., "Electronic Structure of BN, BP and BAs", Physica B, 1998, pp. 229-236, vol. 252.

C.C. Wang, et al., "Preparation, Optical Properties, and Band Structure of Boron Monophosphide", RCA Review, Jun. 1964, pp. 159-167.

Mitsuharu Takigawa, et al., "Hetero-Epitaxial growth of Boron Monophosphide on Silicon Substrate Using $B_2H_6$-$PH_3$-$H_2$ system", Japanese Journal of Applied Physics, vol. 13, No. 3, Mar. 1974, pp. 411-416.

M. Ferhat, et al., "Electronic structure of BN, BP and Bas", Physica B, vol. 252, No. 3, Jul. 31, 1998, pp. 229-236.

Bachir Bouhafs, et al., "Trends in band-gap pressure coefficients in boron compounds BP, BAs, and BSb", Journal of Physics: Condensed Matter, vol. 12, No. 26, Jul. 3, 2000, pp. 5655-5668.

A. Zaoui, et al., "Full potential linearized augmented plane wave calculations of structural and electronic properties of BN, BP, BAs and BSb", Journal of Physics: Condensed Matter, vol. 13, No. 2, Jan. 15, 2001, pp. 253-262.

Y. Kumashiro, et al., "Thermoelectric Properties of Boron and Boron Phosphide CVD Wafers"; 17th International Conference on Thermoelectronics (1998); pp. 591-594.

* cited by examiner

SEMICONDUCTOR DEVICE, SEMICONDUCTOR LAYER AND PRODUCTION METHOD THEREOF

This application claims benefit of U.S. provisional Application No. 60/300,425 filed Jun. 26, 2001, under 35 U.S.C. § 119(e).

TECHNICAL FIELD

The present invention relates to: a boron phosphide (BP) layer having a band gap of 2.8 to 3.4 electron volts (eV) at room temperature or a boron phosphide (BP)-base mixed crystal layer containing boron phosphide, represented by the formula $\beta_\alpha Al_\beta Ga_\gamma In_{1-\alpha-\beta-\gamma} P_\delta As_\epsilon N_{1-\delta-\epsilon}$ (wherein $0<\alpha\leq1$, $0\leq\beta<1$, $0\leq\gamma<1$, $0<\alpha+\beta+\gamma\leq1$, $0<\delta\leq1$, $0\leq\epsilon<1$, $0<\delta\epsilon\leq1$); a semiconductor device having the BP layer or BP-base mixed crystal layer; and a production method of the BP layer or BP-base mixed crystal layer.

BACKGROUND ART

Group III-V compound semiconductors comprising boron (B) which belongs to Group III of the Periodic Table, and an element which belongs to Group V include boron nitride (BN), boron phosphide (BP), and boron arsenide (BAs). For example, hexagonal boron nitride (BN) is an indirect transition-type semiconductor having a band gap of 7.5 electron volts (eV) at room temperature (refer to Iwao Teramoto, Handotai Debaisu Gairon (Outline of semiconductor Devices), 1st Ed., page 28, Baifukan (Mar. 30, 1995)). Boron arsenide (BAs) is known to be an indirect transition-type Group III-V compound having a band gap of about 0.85 eV at room temperature (refer to Handotai Debaisu Gairon (Outline of semiconductor Devices)).

On the other hand, boron phosphide (BP) is a kind of Group III-V compound semiconductor (refer to Nature, 179, No. 4569, page 1075 (1957)) and several values are reported for the band gap of an indirect transition-type semiconductor. For example, B. Stone et al. reports a room temperature band gap of about 6 eV for a polycrystalline BP layer deposited on a quartz plate, which is determined by an optical absorption method (refer to Phys. Rev. Lett., Vol. 4, No. 6, pages 282 to 284 (1960)). According to J. L. Peret, the band gap of BP is determined to be 6.0 eV (refer to J. Am. Ceramic Soc., 47 (1), pages 44 to 46 (1964)). Also, N. Sclar reports, that based on the ion radius value and the covalent radius value, the band gap at absolute zero (=0 K) is 6.20 eV (refer to J. Appl. Phys., 33 (10), pages 2999 to 3002 (1962)). Furthermore, Manca reports a band gap of 4.2 eV (refer to J. Phys. Chem. Solids, 20, pages 268 to 273 (1961)).

On the other hand, R. J. Archer et al. reports a room temperature band gap of 2 eV for cubic BP, which is determined from a single crystal BP grown from a nickel phosphide fused solution (refer to Phys. Rev. Lett., 12 (19), pages 538 to 540 (1964)), and also reports a band gap of 2.1 eV which is determined from a theoretical calculation based on the bonding energy value (refer to J. Appl. Phys., 36, pages 330 to 331 (1965)). Thus, the band gap of boron phosphide (BP) greatly differs (refer to J. Phys. Chem. Solids, 29, pages 1025 to 1032 (1968)), however, a value of about 2 eV has been heretofore commonly employed for the band gap of BP (refer to (1) RCA Review, 25, pages 159 to 167 (1964); (2) Z. anorg. allg. chem., 349, pages 151 to 157 (1967); (3) J. Appl. Phys., 36 (1965); (4) Handotai Debaisu Gairon (Outline of Semiconductor Devices) page 28; and (5) Isamu Akasaki, III-V Zoku Kagobutsu Handotai (Group III-V Compound Semiconductors), 1st Ed., page 150, Baifukan (May 20, 1994)).

The boron phosphide (BP) and the BP-base mixed crystal represented by the compositional formula of $B_X Al_Y Ga_{1-X-Y} N_{1-Z} P_Z$ (wherein $0<X\leq1$, $0\leq Y<1$, $0<X+Y\leq1$, $0<Z\leq1$) are used as a functional layer constituting a semiconductor light-emitting device. In conventional techniques, for example, a single layer comprising BP is used for constituting a buffer layer in a short wavelength visible light-emitting diode (LED) or laser diode (LD) (refer to, JP-A-2-275682) (the term "JP-A" as used herein means an "Japanese Unexamined Patent Application, First Publication No."). Also, a case is known where the light-emitting part of a pn junction-type heterojunction structure is constructed by a super lattice structure of a BP single layer with a $B_X Al_Y Ga_{1-X-Y} N_{1-Z} P_Z$ mixed crystal single layer (refer to JP-A-10-242514). Furthermore, a technique of constructing a clad (barrier) layer by a super lattice structure with a $B_X Al_Y Ga_{1-X-Y} N_{1-Z} P_Z$ mixed crystal single layer is known (refer to JP-A-2-288371). Since boron phosphide (BP) having a band gap of 2 eV at room temperature cannot exert a barrier effect on the light-emitting layer, in the above-described conventional case, a nitrogen-containing mixed crystal layer elevated in the room temperature band gap, for example, to 2.7 eV by forming BP and aluminum nitride (AlN) or the like into a mixed crystal is used (refer to JP-A-2-288371).

Also, a case where a hetero bipolar transistor (HBT) is constructed by using a BP single layer is known (refer to J. Electrochem. Soc., 125(4), pages 633 to 637 (1978)). In this conventional HBT, a BP single layer having a band gap of 2.0 eV is used, which is grown on a silicon (Si) crystal substrate having a (100) plane by a diborane ($B_2H_6$)/phosphine ($PH_3$) vapor phase growth method (refer to, J. Electrochem. Soc., 125 (1978)). Furthermore, a technique of constructing a solar cell by using a BP single layer having a band gap of 2.0 eV as a window layer is disclosed (refer to J. Electrochem. Soc., 125 (1978)).

As described above, semiconductor devices have been heretofore constructed by using boron phosphide (BP) having a band gap of about 2 eV or a mixed crystal containing BP having this band gap. In the above-described solar cell constructed by using Si having a room temperature band gap of 1.1 eV as the matrix material, it is disclosed that even a BP layer having a band gap of 2.0 eV can be effectively used as the window layer because the band gap is larger than that of the matrix Si (refer to, J. Electrochem. Soc., 125 (1978)). On the other hand, however, in conventional techniques of forming a BP layer using Si as the substrate, it is reported that the band gap depends on the plane direction of an Si single crystal as the substrate and is narrowed (refer to Tatau Nishinaga, Oyo Butsuri (Applied Physics), Vol. 45, No. 9, pages 891 to 897 (1976)). Also, it is reported that as compared with the BP layer formed on an Si substrate having a (100) plane, the BP layer formed on an Si substrate having a (111) plane has a large plane defect density and therefore, becomes opaque (refer to Oyo Butsuri (Applied Physics), pages 895 to 896).

Furthermore, it is reported that the lattice constant becomes large due to a large amount of plane defects and the band gap is narrowed even more (refer to Oyo Butsuri (Applied Physics), page 896). The lattice constant and the band gap are conventionally known to be correlated with each other and, as is well known, the band gap increases as the lattice constant becomes smaller (refer to III-V Zoku Kagobutsu Handotai (Group III-V Compound Semiconductors), page 31). In other words, according to conventional studies, it is taught that a BP layer having a band gap smaller than about 2 eV, which is commonly employed as the band gap of BP, is formed depending on the conditions of forming the BP layer. This small band gap gives rise to a problem in that an environment-resistant semiconductor device having a high breakdown voltage cannot be readily constructed from the boron phosphide (BP) crystal layer.

For example, in a heterojunction-type blue LED or LD having a light emission wavelength of 450 nm at room temperature, a light-emitting layer having a room temperature band gap of 2.8 eV is used. In order to achieve a clad effect on this light-emitting layer, the barrier layer must be composed of a semiconductor material having a room temperature band gap of at least about 2.8 eV. Therefore, in constructing a heterojunction light-emitting part of a conventional boron phosphide (BP)-based light-emitting device, there is a problem in that the clad layer cannot be composed of boron phosphide (BP) having a room temperature band gap of about 2 eV. To overcome this problem, in conventional techniques, a mixed crystal containing BP, for example, a $B_xAl_yGa_{1-x-y}N_{1-z}P_z$ multi-element mixed crystal, is formed as described above and a barrier layer having a high band gap is constructed therefrom (refer to JP-A-2-288371). However, it is well known that as the number of elements constituting the mixed crystal increases, a higher level technique is required, for example, to control the composition ratio of the constituent elements and, moreover, a crystal layer having good quality is more difficult to obtain (refer to Handotai Debaisu Gairon (Outline of Semiconductor Devices), page 24). Thus, in view of layer formation, conventional techniques have a problem in that a BP mixed crystal layer as a barrier layer cannot be readily and simply formed.

Also, for example, in a conventional npn-type HBT, a BP layer having a band gap of 2.0 eV is used as an n-type emitter (refer to J. Electrochem. Soc., 125 (1978)). On the other hand, for the p-type base layer, a p-type Si layer is used (refer to J. Electrochem. Soc., 125 (1978)). The band gap of Si is about 1.1 eV and, therefore, the difference in the band gap between the heterojunction structures of the BP emitter layer and the Si base layer is only 0.9 eV. It is considered that if the emitter layer is constructed by a BP layer, which gives a larger difference in the band gap between the emitter layer and the base layer than that in conventional techniques, the leakage of the base current from the base layer to the emitter layer can be suppressed more and the current transmission ratio (=emitter current/collector current) property can be improved (refer to Isamu Akasaki (editor) III-V Zoku Kagobutsu Handotai (Group III-V Compound Semiconductors), pages 239 to 242); as a result, an HBT having excellent characteristics can be produced.

The lattice constant of a boron phosphide (BP) single crystal which is a zinc blende crystal type, more accurately cubic sphalerite type, is 0.4538 nm (refer to Handotai Debaisu Gairon (Outline of semiconductor Devices), page 28). On the other hand, Group III nitride semiconductors having a lattice constant of 0.4538 nm are known, such as a cubic gallium phosphide nitride mixed crystal (compositional formula: $GaN_{0.97}P_{0.03}$) having a nitrogen (N) composition ratio of 0.97, and gallium indium nitride ($Ga_{0.90}In_{0.10}N$) having an indium (In) composition ratio of 0.10. Accordingly, if the BP layer and such a Group III nitride semiconductor are used, a two-dimensional electron gas field effect transistor (TEGFET) of a lattice-matching stacked layer type which is advantageous for obtaining high electron mobility can be constructed (refer to K. Seeger, Semikondakuta no Butsurigaku, (Ge) (Physics of Semiconductors (Final Volume)), 1st printing, pages 352 to 353, Yoshioka Shoten (Jun. 25, 1991)). For example, the TEGFET can be constructed by using the above-described direct transition-type Group III nitride semiconductor as a two-dimensional electron gas (TEG) channel layer and the indirect transition-type BP layer as a spacer layer or an electron supply layer. In the Group III nitride semiconductor TEGFET using a BP layer, if a spacer layer or an electron supply layer forming a heterojunction with an electron channel layer is composed of boron phosphide (BP) having a band gap larger than that in conventional techniques, the barrier difference at the heterojunction interface with the electron channel layer can be made large. This is advantageous for accumulating two-dimensional electrons in the region of the electron channel layer near the heterojunction interface. As a result, a Group III nitride semiconductor TEGFET realizing high electron mobility can be obtained.

If a BP layer having a large room temperature band gap can be used, the discontinuity of the conduction band with other semiconductor layers can also be made larger. A heterojunction structure having a large band discontinuity and a large barrier difference is effective for achieving high electron mobility, because two-dimensional electrons can be efficiently accumulated. In the case of a Hall device, which is a magnetoelectric converting device, use of a structure having high electron mobility is advantageous for obtaining a device having a higher sensitivity to magnetism (refer to Shoei Kataoka, Jiden Henkan Soshi (Magnetoelectric Converting Devices), 4th printing, pages 56 to 58, Nikkan Kogyo Shinbun (Feb. 1, 1971)). Accordingly, the realization of a heterojunction structure containing a BP layer having a band gap larger than that in conventional techniques is considered to contribute also to the construction of a high-sensitivity Hall device capable of exhibiting high product sensitivity (refer to Jiden Henkan Soshi (Magnetoelectric Converting Devices), page 56).

Also, for example, in the case of a Schottky barrier diode using an Si single crystal substrate, if a BP layer having a room temperature band gap in excess of about 2 eV can be formed, this can contribute to the construction of a Schottky barrier diode having a high breakdown voltage. It is considered that as the band gap is made larger, the intrinsic carrier density in the properties of a semiconductor material can be more suppressed (refer to (III-V Zoku Kagobutsu Handotai (Group III-V Compound Semiconductors), pages 172 to 174), and therefore, such a BP layer is advantageous for constructing an environment-resistant device capable of operating at high temperatures.

As in these conventional cases, semiconductor devices have been heretofore constructed by using a BP layer having a band gap of about 2 eV. If a BP layer having a larger band gap can be formed, it is expected that the semiconductor device can be improved and enhanced in its properties. In the studies so far, a case where a BP layer having a high band gap of about 6 eV is formed is known as described above (refer to Phys. Rev. Lett., 4 (6) (1960)). However, this is a polycrystalline layer and is not necessarily suitable for the construction of an active layer or a functional layer of a semiconductor device. In a wide gap semiconductor having such a large band gap, the control of the conduction type by impurity doping and the control of carrier density are difficult. A BP layer suitable for the construction of a functional layer in a semiconductor device, such as a spacer layer or an electron supply layer in a TEGFET or an emitter layer in an HBT, is a BP crystal layer having a band gap of about 3 eV.

According to studies so far on the band gaps of compound semiconductors, it is known that as the average atomic number of the constituent elements is made smaller, the band gap tends to become larger (refer to Kazuo Fueki, et al., Oyo Kagaku Shirizu 3, Denshi Zairyo no Kagaku (Applied Chemistry Series 3, Chemistry of Electronic Materials), pages 26 to 29, Maruzen (Jul. 20, 1981)). The average atomic number is the arithmetic mean value of the atomic numbers of the elements constituting the compound semiconductor. FIG. 1 shows the relationship between the band gap at room temperature and the average atomic number of various Group III-V compound semiconductors. For example, the room temperature band gap of gallium arsenide (GaAs) (average atomic number=32) comprising gallium (Ga) (atomic number=31) and arsenic (As) (atomic number=33) is 1.43 eV (refer to Handotai Debaisu Gairon (Outline of semiconductor Devices), page 28). On the other hand, the room temperature band gap of gallium phosphide (GaP) (average atomic number=23) having an average atomic number smaller than that of GaAs is as large as 2.26 eV (refer to Handotai Debaisu Gairon (Outline of semiconductor Devices), page 28). This relationship applies to Group II-VI compound semiconductors and it is taught that as the average atomic number of the constituent atoms is made smaller, the band gap tends to become larger (refer to K. Seeger, Semikondakuta no Butsurigaku (Jo) (Physics of Semiconductors (First Volume)), 1st printing, page 36, Yoshioka Shoten (Jun. 10, 1991)).

It is said that based on this tendency of the room temperature band gap in relation to the average atomic number, it can be presumed that the band gap of Group III-V compound semiconductors has a relatively large ionic bonding property. Assuming that this tendency is applicable also to a BP crystal having a small difference in the electronegativity between the constituent elements and having a strong covalent bonding property, the band gap of the BP single crystal layer is presumed to be about 3 eV. Furthermore, according to the "Dielectric Method" proposed by Van Vechten (refer to: (1) J. A. Van Vechten, Phys. Rev. Lett., 182 (1969), 891; and (2) Isamu Akasaki (editor), III Zoku Chikkabutsu Handotai (Group III Nitride Semiconductors), 1st Ed., pages 19 to 21, Baifukan (Dec. 8, 1999)), the band gap of a BP single crystal is calculated as 2.98 eV. In this theoretical calculation of the band gap, the lattice constants of carbon (diamond) (C) and silicon (Si) single crystals are set to 0.3567 nm and 0.4531 nm, respectively. The minimum interatomic distances of C (diamond) and Si are set to 0.154 nm and 0.234 nm, respectively (refer to Kagaku Binran Kisohen (Handbook of Chemistry, Elementary), 3rd printing, page 1259, Maruzen (Aug. 20, 1970)). As for the other values necessary for the calculation, the proposed values are used (refer to III Zoku Chikkabutsu Handotai (Group III Nitride Semiconductors), pages 20 to 21).

At present, boron phosphide (BP) having a room temperature band gap of about 3 eV and a boron phosphide (BP)-base mixed crystal containing a BP crystal thereof, of which a single layer is advantageous for the construction of the above-described semiconductor devices, have not yet been disclosed. This is attributable to the fact that a method for forming a BP crystal layer having excellent crystallinity is not clearly known. More specifically, a method for forming a layer which gives a BP-base mixed crystal having a band gap suitable for the construction of a semiconductor device is not clearly known. In order to improve the properties of semiconductor devices using a BP crystal layer, a method for forming a BP crystal layer having a band gap of about 3 eV must be established. However, despite the layer formation of BP crystal layers heretofore practiced using a vapor-phase growth method or the like, a method for forming a BP crystal layer which gives a band gap of about 3 eV has not yet been disclosed.

DISCLOSURE OF THE INVENTION

The present invention has been made in light of these circumstances and the object of the present invention is to clarify the construction of a BP layer having a band gap of 2.8 to 3.4 electron volts (eV) at room temperature or a boron phosphide (BP)-base mixed layer containing boron phosphide, represented by the formula of $B_\alpha Al_\beta Ga_\gamma In_{1-\alpha-\beta-\gamma} P_\delta As_\epsilon N_{1-\delta-\epsilon}$ ($0<\alpha\leq1$, $0\leq\beta<1$, $0\leq\gamma<1$, $0<\alpha+\beta+\gamma\leq1$, $0<\delta\leq1$, $0\leq\epsilon<1$, $0<\delta+\epsilon\leq1$), the construction of a semiconductor device having the above-described BP layer or BP-base mixed crystal layer, and the construction of a production method for the BP layer or BP-base mixed crystal layer, and thereby to provide a semiconductor device which has improved and enhanced semiconductor device properties, a semiconductor layer therefor, and a production method of the semiconductor layer.

More specifically, the present invention provides:

(1) a semiconductor device having a semiconductor layer comprising boron phosphide (BP) having a band gap of not less than 2.8 eV and not more than 3.4 eV at room temperature;

(2) the semiconductor device as described in (1), which has a heterojunction of a semiconductor layer comprising boron phosphide (BP) and another semiconductor layer having a band gap different from that of the semiconductor layer comprising BP;

(3) the semiconductor device as described in (2), wherein the semiconductor layer comprising boron phosphide (BP) and the semiconductor layer which forms a heterojunction with the semiconductor layer comprising BP are lattice-matched;

(4) the semiconductor device as described in (3), wherein the semiconductor layer which forms a heterojunction with the semiconductor layer comprising boron phosphide (BP) is $GaN_{0.97}P_{0.03}$; and (5) the semiconductor device as described in any one of (1) to (4), wherein the semiconductor layer comprising boron phosphide (BP) is stacked on a crystal substrate.

The present invention also provides:

(6) a semiconductor device having a semiconductor layer comprising a boron phosphide (BP)-base mixed crystal which contains boron phosphide (BP) having a band gap of not less than 2.8 eV and not more than 3.4 eV at room temperature and which is represented by the formula: $B_\alpha Al_\beta Ga_\gamma In_{1-\alpha-\beta-\gamma} P_\delta As_\epsilon N_{1-\delta-\epsilon}$ ($0<\alpha\leq1$, $0\leq\beta<1$, $0\leq\gamma<1$, $0<\alpha+\beta+\gamma\leq1$, $0<\delta\leq1$, $0\leq\epsilon<1$, $0<\delta+\epsilon\leq1$);

(7) the semiconductor device as described in (6), wherein the boron phosphide (BP)-mixed crystal is a boron aluminum phosphide mixed crystal ($B_X Al_{1-X} P$: $0<X<1$), a boron gallium phosphide mixed crystal ($B_X Ga_{1-X} P$: $0<X<1$) or a boron indium phosphide mixed crystal ($B_X In_{1-X} P$: $0<X<1$);

(8) the semiconductor device as described in (6) or (7), which has a heterojunction of a semiconductor layer comprising a boron phosphide (BP)-base mixed crystal with another semiconductor layer having a band gap different from that of the semiconductor layer comprising BP-base mixed crystal;

(9) the semiconductor device as described in (8), wherein the semiconductor layer comprising boron phosphide (BP)-base mixed crystal and the semiconductor layer which forms a heterojunction with the semiconductor layer comprising the BP-base mixed crystal are lattice-matched; and

(10) the semiconductor device as described in any one of (6) to (9), wherein the semiconductor layer comprising the boron phosphide (BP)-base mixed crystal is stacked on a crystal substrate.

The present invention also provides:

(11) the semiconductor device as described in any one of (1) to (10), which has a pn junction structure;

(12) the semiconductor device as described in (11), which is a light-emitting device;

(13) the semiconductor device as described in any one of (1) to (10), which is a photodetecting device;

(14) the semiconductor device as described in any one of (1) to (10), which is a transistor;

(15) the semiconductor device as described in (14), which is a field effect transistor (FET);

(16) the semiconductor device as described in (14), which is a heterojunction bipolar transistor (HBT); and

(17) the semiconductor device as described in any one of (1) to (10), which is a Hall device.

The present invention also provides:

(18) a semiconductor layer comprising boron phosphide (BP) having a band gap of not less than 2.8 eV and not more than 3.4 eV at room temperature;

(19) the semiconductor layer as described in (18), wherein the semiconductor layer comprising boron phosphide (BP) is stacked on a crystal substrate;

(20) a semiconductor layer comprising a boron phosphide (BP)-base mixed crystal which contains boron phosphide (BP) having a band gap of not less than 2.8 eV and not more than 3.4 eV at room temperature and which is represented by the formula: $B_\alpha Al_\beta Ga_\gamma In_{1-\alpha-\beta-\gamma} P_\delta As_\epsilon N_{1-\delta-\epsilon}$ ($0<\alpha\leq1$, $0\leq\beta<1$, $0\leq\gamma<1$, $0<\alpha+\beta+\gamma\leq1$, $0<\delta=1$, $0=\epsilon<1$, $0<\delta+\epsilon\leq1$);

(21) the semiconductor layer as described in (20), wherein the boron phosphide (BP)-base mixed crystal is a boron aluminum phosphide mixed crystal ($B_X Al_{1-X} P$: $0<X<1$), a boron gallium phosphide mixed crystal ($B_X Ga_{1-X} P$: $0<X<1$) or a boron indium phosphide mixed crystal ($B_X In_{1-X} P$: $0<X<1$); and

(22) the semiconductor layer as described in (20) or (21), wherein the semiconductor layer comprising the boron phosphide (BP)-base mixed crystal is stacked on a crystal substrate.

The present invention also provides:

(23) a method for growing the semiconductor layer as described in (18) or (20), comprising forming a semiconductor layer by a metallo-organic chemical vapor deposition method (MOCVD method) at a temperature higher than 750° C. and not higher than 1200° C., with the ratio of the total supply amount of Group V element sources including phosphorus (P) to the total supply amount of Group III element sources including boron (B) being not less than 15 and not more than 60, and the growth rate of the semiconductor layer being not less than 2 nm/min and not more than 30 nm/min; and

(24) the method for growing a semiconductor layer as described in (23), comprising forming on a crystal substrate a buffer layer composed of a boron phosphide or a boron phosphide-base mixed crystal with the major part being amorphous, by an MOCVD method, at a temperature not lower than 250° C. and not higher than 750° C., and growing a semiconductor layer on the buffer layer.

The present invention also provides:

(25) a semiconductor device comprising a crystal substrate and a semiconductor layer as described in (18) or (20) wherein the semiconductor layer is stacked on the crystal substrate;

(26) a semiconductor device comprising a substrate, a first semiconductor layer as described in (18) or (20) and a second semiconductor layer having a band gap different from that of the first semiconductor layer, wherein the first semiconductor layer and the second semiconductor layer form a heterojunction;

(27) the semiconductor device as described in (26), wherein the first semiconductor layer and the second semiconductor layer are lattice-matched; and

(28) the semiconductor device as described in any of (25) to (27), which has a pn junction structure.

The present invention also provides:

(29) a method for growing the semiconductor layer described in any one of (18) to (22), comprising growing the semiconductor layer by a vapor phase growth method;

(30) the method for growing the semiconductor layer as described in (29), wherein the semiconductor layer is grown at a temperature higher than 750° C. and not higher than 1,200° C.;

(31) the method for growing the semiconductor layer as described in (29) or (30), wherein the vapor phase growth method is a metallo-organic chemical vapor deposition method (MOCVD method); and

(32) the method for growing the semiconductor layer as described in (31), wherein during the growth of the semiconductor layer, the ratio of the total supply amount of Group V element sources including phosphorus (P) to the total supply amount of Group III element sources including boron (B) is not less than 15 and not more than 60, and the growth rate of the semiconductor layer is not less than 2 nm/min and not more than 30 nm/min.

The present invention also provides:

(33) a method for growing a semiconductor layer, comprising forming on a crystal substrate a buffer layer composed of a boron phosphide (BP) or boron phosphide (BP)-base mixed crystal with the major part being amorphous, at a temperature not lower than 250° C. and not higher than 750° C. by an MOCVD method, and growing on the buffer layer a semiconductor layer composed of a boron phosphide (BP) having a band gap at room temperature of not less than 2.8 eV and not more than 3.4 eV;

(34) a method for growing a semiconductor layer, comprising forming on a crystal substrate a buffer layer composed of a boron phosphide (BP) or boron phosphide (BP)-base mixed crystal with the major part being amorphous, at a temperature not lower than 250° C. and not higher than 750° C. by an MOCVD method, and growing on the buffer layer a semiconductor layer composed of a boron phosphide (BP)-base mixed crystal which contains boron phosphide (BP) having a band gap at room temperature of not less than 2.8 eV and not more than 3.4 eV and which is represented by the formula: $B_\alpha Al_\beta Ga_\gamma In_{1-\alpha-\beta-\gamma} P_\delta As_\epsilon N_{1-\delta-\epsilon}$ ($0<\alpha\leq1$, $0\leq\beta<1$, $0\leq\gamma<1$, $0<\alpha+\beta+\gamma=1$, $0<\delta=1$, $0\leq\epsilon<1$, $0<\delta+\epsilon\leq1$);

(35) the method for growing a semiconductor layer as described in (34), wherein the boron phosphide (BP)-base mixed crystal is a boron aluminum phosphide mixed crystal ($B_X Al_{1-X} P$: $0<X<1$), a boron gallium phosphide mixed crystal ($B_X Ga_{1-X} P$: $0<X<1$), or a boron indium phosphide mixed crystal ($B_X In_{1-X} P$: $0<X<1$);

(36) the method for growing a semiconductor layer as described in any one of (33) to (35), wherein the semiconductor layer is grown at a temperature higher than 750° C. and not higher than 1,200° C. by a vapor phase growth method; and

(37) the method for growing a semiconductor layer as described in any one of (33) to (36), wherein the semiconductor layer is grown by an MOCVD method.

BEST MODE FOR CARRYING OUT THE INVENTION

Figure 1:
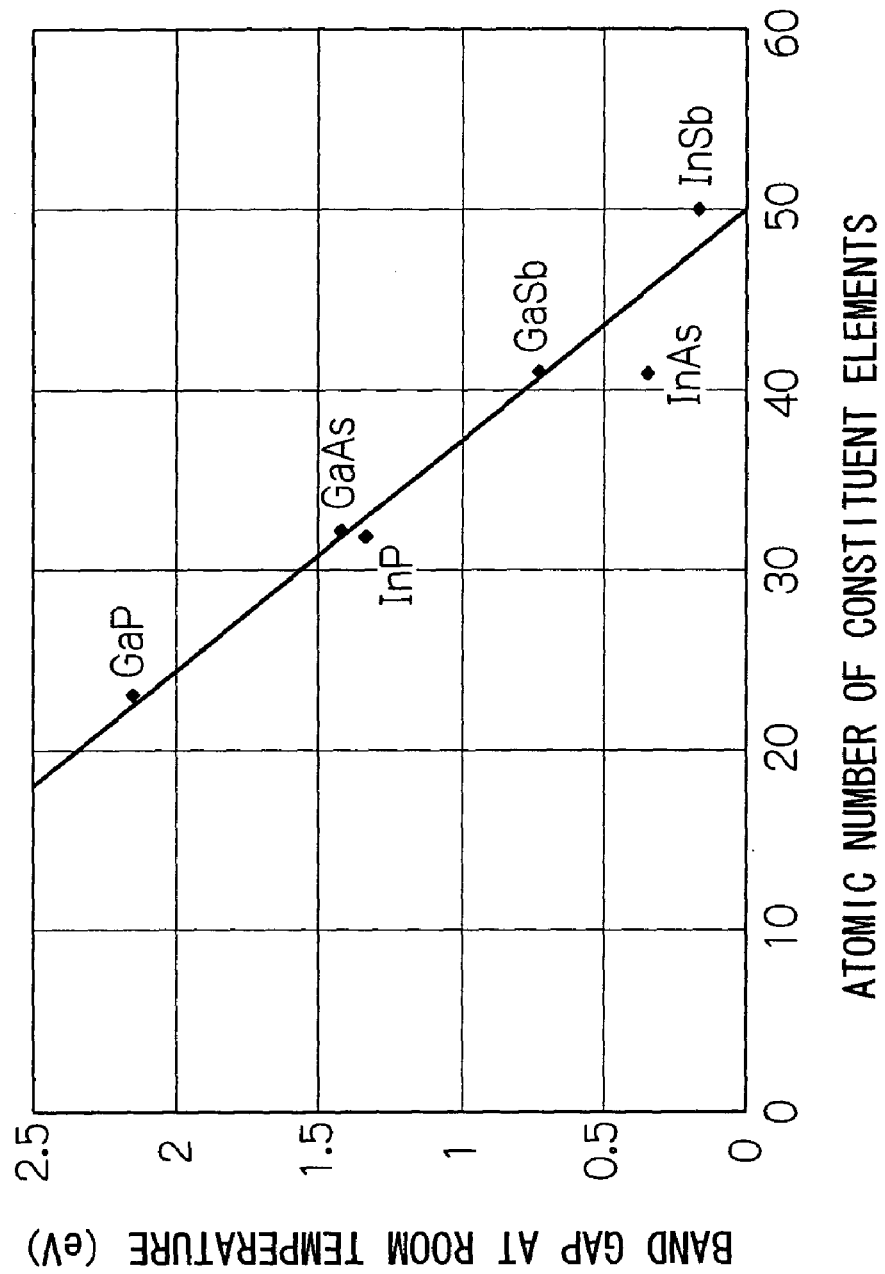
FIG. 1 is a graph showing the correlation between the band gap at room temperature of Group III-V compound semiconductors and the average atomic number of the constituent elements.

The semiconductor device having a semiconductor layer composed of boron phosphide (BP) or a boron phosphide (BP)-base mixed crystal according to the present invention can be constructed by using, for example, a semiconductor single crystal such as silicon (Si), gallium phosphide (GaP), or gallium arsenide (GaAs) as the substrate. Use of such a semiconductor single crystal having electrical conductivity as the substrate, for example, in an LED, LD, or photodetecting device is advantageous in that an electrode can be simply disposed and, therefore, the light-emitting or photodetecting device can be readily constructed. Silicon (Si single crystal) having a high melting point, as compared with a Group III-V compound semiconductor, has heat resistance even at an epitaxial growth temperature of about 1,000° C. and, therefore, can be suitably used as a substrate crystal. Also in the case of integrating various devices, silicon can be suitably used as a substrate. An oxide single crystal such as sapphire ($\alpha$-$Al_2O_3$ single crystal) exerts an effect, for example, of preventing the leakage of a device operating current by virtue of its electrical insulating property and, therefore, can be suitably used, for example, for a field effect transistor (FET) where the leakage amount of a drain current is to be suppressed. Diamond (C) and silicon carbide (SiC) have a relatively high thermal conductivity and, therefore, are suitable particularly as a substrate for an FET for power, where the device must be cooled.

The plane direction on the surface of the substrate is preferably represented by a low Miller index plane such as {100}, {110}, or {111}. An Si single crystal, the surface of which is a plane inclined at an angle of several to tens of degrees from the low Miller index plane, can also be used as a substrate. On the {111} crystal plane of a zinc blende crystal such as Si, GaP, and GaAs, atoms constituting the crystal are densely present as compared with the {100} crystal plane and this is effective in preventing the atoms constituting an epitaxial growth layer from diffusing into or invading the inside of the substrate. A single crystal having a high Miller index plane such as {311} or {511} is also effective in preventing the elements constituting the growth layer from invading the inside of a single crystal substrate, such as channeling (refer to R. G. Wilson and G. R. Brewer, Ion Beams with Application to Ion Implantation, (John Wiley & Sons, Inc., pages 263 to 265 (1973)); however, the growth direction of the upper epitaxial growth layer shows higher indexes by reflecting the plane direction on the substrate surface and this causes a problem in some cases in that cutting into individual devices is complicated, for example.

The semiconductor device having a semiconductor layer composed of boron phosphide (BP) according to the present invention is characterized by having a boron phosphide (BP) semiconductor layer having a band gap in a specific range. The semiconductor device having a semiconductor layer composed of a boron phosphide (BP)-base mixed crystal according to the present invention is characterized by having a BP-base mixed crystal layer containing BP having a specific band gap. The BP-base mixed crystal layer is a Group III-V compound semiconductor mixed crystal containing boron (B) and phosphorus (P) as constituent elements. Examples thereof include a mixed crystal represented by the formula: $B_\alpha Al_\beta Ga_\gamma In_{1-\alpha-\beta-\gamma} P_\delta As_\epsilon N_{1-\delta-\epsilon}$ ($0<\alpha\leq1$, $0\leq\beta<1$, $0\leq\gamma<1$, $0<\alpha+\beta+\gamma\leq1$, $0<\delta\leq1$, $0\leq\epsilon<1$, $0<\delta+\epsilon\leq1$). Specific examples thereof include a boron aluminum phosphide ($B_XAl_{1-X}P$: $0\leq X\leq1$) mixed crystal, a boron gallium phosphide ($B_XGa_{1-X}P$: $0=X=1$), mixed crystal and a boron indium phosphide ($B_XIn_{1-X}P$: $0\leq X\leq1$) mixed crystal. Other examples thereof include boron phosphide nitride ($BP_YN_{1-Y}$: $0<Y\leq1$), boron phosphide arsenide ($BP_YAs_{Y-1}$: $0<Y\leq1$) and boron gallium phosphide arsenide ($B_XGa_{1-X}P_YAs_{1-Y}$: $0<X\leq1$, $0<Y\leq1$).

The mechanical or electrical specification of the boron phosphide (BP) or boron phosphide (BP)-base mixed crystal layer is appropriately set according to the device. In the case of an electron supply layer of an n-channel type TEGFET having an n-type electron channel layer, an n-type BP layer having, for example, a layer thickness of about 10 nm to about 50 nm and a carrier concentration of about $1\times10^{18}$ $cm^{-3}$ to about $5\times10^{18}$ $cm^{-3}$ is used. In a light-emitting diode (LED), the window layer which allows the emitted light to efficiently penetrate to the outside is n-type or p-type in correspondence with the conduction form of the underlying layer such as a clad layer, and is constructed from a BP layer or BP-base mixed crystal layer having good conductivity in excess of about $1\times10^{18}$ $cm^{-3}$, for example. In a laser diode (LD), the current blocking layer is constructed from an electrically conducting layer having a conduction form which is opposite to that of the underlying layer such as an upper clad layer, or a BP or BP-base mixed crystal layer having a high resistance. A boron phosphide (BP) binary semiconductor is an indirect semiconductor (refer to Handotai Debaisu Gairon (Outline of semiconductor Devices), page 28). On the other hand, BP has a small ionic bonding property of 0.006 according to Philips (refer to Handotai Ketsugoron (Semiconductor Bonding Theory), pages 49 to 51). Accordingly, the electrical activation ratio of a dopant is high, and a BP crystal layer having a high carrier concentration and a low resistance can be readily obtained. In the present invention, this BP layer having a low resistance is preferably used, for example, as the current diffusion layer in an LED or as the ohmic contact layer in an LD or FET to fabricate a BP-base semiconductor device. In a BP-base semiconductor device requiring an electrically conducting buffer layer, the BP layer is suitably used for constituting the electrically conducting buffer layer.

The BP crystal layer and the BP-base mixed crystal layer according to the present invention are grown by a commonly known vapor phase growth method such as a metallo-organic chemical vapor deposition (MOCVD) method (refer to Inst. Phys. Conf. Ser., No. 129, IOP Publishing Ltd., pages 157 to 162 (1993)), a molecular beam epitaxy (MBE) method (refer to J. Solid State Chem., 133, pages 269 to 272 (1997)), a halide method, and a hydride method. The metallo-organic chemical vapor deposition method is one vapor phase growth method which uses an organic compound of boron as the boron (B) source. In the MOCVD method, for example, a boron gallium phosphide ($B_X Ga_{1-X} P$: $0 \leq X \leq 1$) mixed crystal grows using a starting material system composed of triethylborane (($C_2 H_5)_3 B$), trimethylgallium (($CH_3)_3 Ga$), triethylgallium (($C_2 H_5)_3 Ga$), or an organic phosphorus compound such as phosphine ($PH_3$) and trialkylphosphide. In the vapor phase growth of a boron phosphide (BP) crystal layer by the halide method, for example, a boron halide such as boron trichloride ($BCl_3$) can be used as the boron (B) source, and a phosphorus halide such as phosphorus trichloride ($PCl_3$) can be used as the phosphorus (P) source (refer to Nippon Kessho Seicho Gakkaishi (Journal of the Japanese Association for Crystal Growth Society), Vol. 24, No. 2, page 150 (1997)). Also, a halide method using boron trichloride ($BCl_3$) as the boron source is known (refer to J. Appl. Phys., 42(1), pages 420 to 424 (1971)). In the hydride method, the BP crystal layer can be grown using, for example, a boron hydride such as borane ($BH_3$) or diborane ($B_2 H_6$) as the boron (B) source and a phosphorus hydride such as phosphine ($PH_3$) as the phosphorus source (refer to: (1) J. Crystal Growth, 24/25, pages 193 to 196 (1974); and (2) J. Crystal Growth, 132, pages 611 to 613 (1993)).

The vapor phase growth method is advantageous in that the layer thickness and the mixed crystal composition ratio of the BP-base mixed crystal layer can be readily controlled as compared, for example, with a conventional so-called liquid phase growth method of growing a boron phosphide (BP) crystal from a nickel (Ni)-phosphorus (P) fused solution or a copper (Cu)-phosphorus (P) fused solution (refer to J. Electrochem. Soc., 120 (6), pages 802 to 806 (1973)). Also, the vapor phase growth method is advantageous in that a heterojunction structure of a BP layer or BP base mixed crystal layer with another semiconductor layer can be readily formed. Particularly, when an MOCVD means equipped with a piping system capable of steep changing the species of a gas starting material fed to the growth reaction furnace is used, the composition of the crystal layer can be abruptly changed. A so-called abrupt heterojunction interface structure where the composition is abruptly changed at the heterojunction interface is effective in accumulating low-dimensional electrons. Accordingly, the abrupt heterojunction interface structure with a BP layer or a BP-base mixed crystal layer, formed by the MOCVD method, has an effect of yielding a BP-base semiconductor device, such as a TEGFET, having excellent electron mobility.

The temperature during the growth of a BP layer or a BP-base mixed crystal layer is determined by taking account of the vapor phase growth method, the crystal material as a substrate, and the crystal form of the target BP layer or BP-base mixed crystal layer. In order to obtain a single crystal BP layer, a high temperature exceeding 750° C. is generally necessary almost independently of the vapor phase growth means. In order to obtain a single crystal BP layer by an atmospheric pressure (almost atmospheric pressure) or reduced pressure MOCVD means using a reaction system of triethylborane (($C_2 H_5)_3 B$)/phosphine ($PH_3$)/hydrogen ($H_2$), a temperature higher than 750° C. and not higher than 1,200° C. is suitable (refer to U.S. Pat. No. 6,069,021). In other words, the substrate material must be selected from crystals having a heat resistance sufficiently high to cause no denaturing at such a high temperature. Examples of the substrate material having a heat resistance in this high temperature region include a boron phosphide (BP) single crystal (refer to: (1) Z. anorg. allg. chem., 349 (1967); (2) Kristall und Technik, 2 (4), pages 523 to 534 (1967); (3) Kristall und Technik, 4 (4), pages 487 to 493 (1969); and (4) J. Electrochem. Soc., 120 (1973)), sapphire ($\alpha$-$Al_2 O_3$), silicon carbide (SiC) (refer to J. Appl. Phys., 42 (1) (1971)), and silicon (silicon single crystal). At high temperatures exceeding 1,200° C., a polyhedral boron phosphide, represented by the molecular formula $B_6 P$ or $B_{13} P_2$, is readily formed (refer to J. Am. Ceram. Soc., 47 (1), pages 44 to 46 (1964)), and this is a disadvantage in obtaining a single crystal layer comprising boron monophosphide. From the single crystal BP layer or BP-base mixed crystal layer, for example, an electron supply layer of a TEGFET or a clad layer of an LED or LD can be constructed. The crystal form (structure) of the grown BP layer or mixed crystal layer thereof can be determined from the diffraction pattern according to general X-ray diffraction analysis (XRD) or electron-beam diffraction. In the case of a single crystal, spot-like diffraction points are obtained (refer to J. Crystal Growth, 70 (1984), pages 507 to 514).

In order to obtain an amorphous or polycrystalline BP crystal layer by the MOCVD means using the same reaction system, a relatively low temperature not lower than 250° C. and not higher than 750° C., is suitable (refer to U.S. Pat. No. 6,069,021). At the time of forming on a substrate a stacked layer structure for use in a phosphorus-base semiconductor device, which contains a growth layer largely lattice-mismatched to the crystal constituting the substrate, the BP layer or BP-base mixed crystal layer with the major part being amorphous exerts an effect of relaxing the lattice mismatch and of providing a growth layer having excellent crystallinity. Also, the BP layer or BP-base mixed crystal layer with the major part being amorphous effectively acts to prevent the removal of the growth layer from the substrate surface, which is caused mainly due to a difference in the thermal expansion coefficient between the substrate material and the growth layer. Accordingly, the BP layer with the major part being amorphous can be used, for example, as a buffer layer which constitutes a phosphorus-base semiconductor device. The buffer layer can also be formed, for example, from a stacking structure obtained by stacking a boron phosphide (BP) single crystal layer grown at a higher temperature on an amorphous boron phosphide layer grown at a low temperature (refer to U.S. Pat. No. 6,029,021). Also in the case of using substrate lattice-mismatching to BP, if the amorphous BP layer is allowed to be interposed, a BP single crystal layer having excellent crystallinity can be readily obtained. For example, in the case of a boron phosphide-base semiconductor light-emitting device, the buffer layer comprising a stacking structure is advantageous in that a light-emitting part which provides high-intensity light emission can be formed. Furthermore, for example, in the case of a boron phosphide-base HBT, the buffer layer of a stacking structure is advantageous in that a good quality collector layer or sub-collector layer which has fewer crystal defects, such as misfit dislocation attributable to lattice mismatch, can be formed thereon.

A growth layer lattice-matched to the single crystal substrate can also be constructed from the BP-base mixed crystal layer. For example, a boron gallium phosphide mixed crystal ($B_{0.02}Ga_{0.98}P$) (refer to JP-A-11-266006) having a boron composition ratio of 0.02 (boron phosphide mixed crystal ratio=2%) is a BP-base mixed crystal layer having a lattice constant of 0.54309 nm. Accordingly, a growth layer lattice-matched to an Si single crystal (lattice constant=0.54309 nm) can be constructed from $B_{0.02}Ga_{0.98}P$ (refer to JP-A-11-266006). The growth layer lattice-matched to an Si single crystal substrate can also be constructed from a boron indium phosphide mixed crystal ($B_{0.33}In_{0.67}P$) having a BP mixed crystal ratio of 33%. The BP-base mixed crystal growth layer lattice-matched to the substrate can constitute a good quality buffer layer, for example. Also, a magnetic sensing layer, which exhibits high electron mobility suitable for obtaining a Hall device having high product sensitivity can be constituted. Furthermore, the BP-base mixed crystal growth layer lattice-matched to the substrate can also be suitably used for the light transmission layer (window layer) of a photodetecting device, for example.

The semiconductor device having a semiconductor layer composed of boron phosphide (BP) of the present invention is constructed using a boron phosphide (BP) semiconductor layer having a band gap of not less than 2.8 eV and not more than 3.4 eV at room temperature. The semiconductor device having a semiconductor layer composed of a boron phosphide (BP)-base mixed crystal of the present invention is constructed using a BP-base mixed crystal semiconductor layer containing BP having a band gap of not less than 2.8 eV and not more than 3.4 eV at room temperature. Room temperature is about 20° C. More specifically, a BP-base semiconductor device is constructed using a BP layer or BP mixed crystal layer having a conventionally unknown medium band gap which exceeds 2 eV heretofore established as a band gap of BP but which is not as high as 4.2 eV to 6.0 eV as reported conventionally. The boron phosphide (BP) layer having a band gap of not less than 2.8 eV and not more than 3.4 eV at room temperature can be formed by prescribing its growth conditions, particularly by setting both the growth rate and the supply ratio of starting materials to respective prescribed ranges. The growth rate of the boron phosphide (BP) layer or BP-base mixed crystal layer is preferably from not less than 2 nm/min and not more than 30 nm/min. If the growth rate is set to a low rate of less than 2 nm/min, the phosphorus (P) constituent element or a compound thereof cannot be sufficiently prevented from being desorbed or volatilized from the surface of the growth layer, and the layer formation may fail. If the growth rate is set to a high rate in excess of 30 nm/min, the band gap value obtained is undesirably unstable. Also, if the growth rate is set high for no reason, a polycrystalline layer tends to grow readily and this is disadvantageous in obtaining a single crystal layer.

In addition to the growth rate, the supply ratio of the starting materials is preferably prescribed to the range not less than 15 and not more than 60. In the case of forming a BP layer, the supply ratio of the starting materials is the ratio of the amount of phosphorus (P) source supplied to the growth reaction system to the amount of boron (B) source supplied. In the case of forming a BP-base mixed crystal, the supply ratio is the ratio of the total supply amount of Group V element sources including phosphorus (P) to the total supply amount of Group III element sources including boron (B). For example, in the case of forming a boron indium phosphide ($B_XIn_{1-X}P$: $0 \leq X \leq 1$) mixed crystal, the supply ratio of the starting materials is the ratio of the amount of phosphorus (P) source supplied to the growth reaction system to the total amount of boron (B) source and indium (In) source supplied, that is, the so-called V/III ratio. If the V/III ratio is set to less than 15, the growth layer surface is undesirably disordered, whereas if the III/V ratio is set to be extremely large in excess of 60, a growth layer rich in phosphorus (P) is stoichiometrically readily formed. Excess phosphorus (P) is found to enter into the position to be occupied by boron in the crystal lattice and to act as a donor (refer to Katsufusa Shono, Cho LSI Jidai no Handotai Gijutsu 100 Shu [5] (Semiconductor Techniques in the VLSI Generation 100 Series [5]), Ohmusha (May 1, 1974), appendix of "Electronics" (May, 1974), Vol. 29, No. 5, page 121). The zinc blende-type crystal to which a BP or a BP-base mixed crystal belongs originally has a degenerated valence band structure where a p-type semiconductor layer is readily obtained (refer to Toshiaki Ikoma and Hideaki Ikoma, Kagobutsu Handotai no Kiso Bussei Nyumon (Basic Physical Properties of Compound Semiconductors, Elementary), 1st Ed., pages 14 to 17, Baifukan (Sep. 10, 1991)). Nevertheless, if a stoichiometric composition is transferred to the phosphorus (P) rich side, the formation of a p-type crystal layer having low resistance is disadvantageously hindered.

On reviewing the formation conditions of a BP layer in conventional vapor phase growth methods, a growth rate of about 120 Å/min to about 700 Å/min is reported for the hydride method using a diborane ($B_2H_6$)/phosphine ($PH_3$)/hydrogen ($H_2$) system (refer to Jpn. J. Appl. Phys., 13 (3) (1974)). On the other hand, in this hydride growth method, it is stated that the V/III ratio (=$PH_3/B_2H_6$) must be set to about 50 or more for the growth of the BP layer to occur (refer to Jpn. J. Appl. Phys., 13 (1974)). In particular for obtaining a single crystal BP layer, it is stated that the V/III ratio must be increased to 250 (refer to Jpn. J. Appl. Phys., 13 (1974)). In other examples of forming a BP layer using diborane and phosphine as starting materials, the growth rate is set to 40 nm/min at the lowest (Katsufusa Shono, Handotai Gijutsu (Jo) (Semiconductor Technology (First Volume), 9th printing, pages 74 to 77, Tokyo University Shuppan Kai (Jun. 25, 1992)). Furthermore, it is stated that the V/III ratio must be set to 100 times or more so as to obtain a BP layer which exhibits the properties of a semiconductor (refer to, Handotai Gijutsu (Jo) (Semiconductor Technology (First Volume), pages 76 to 77). Accordingly, in the conventional hydride method using a diborane ($B_2H_6$)/phosphine ($PH_3$)/hydrogen ($H_2$) system, a low growth rate as referred to in the present invention can be employed; however, the V/III ratio cannot be set at the same time to satisfy the range prescribed in the present invention.

In the halogen method using a chloride as a starting material, even if the V/III ratio is set to satisfy the range of the present invention, there is a problem in that a BP layer which is being grown or the Si substrate itself is etched by the halide generated upon decomposition of the starting material halide during the vapor phase growth, and a BP layer having a flat surface can hardly be obtained. For growing a BP layer or BP-base mixed crystal layer under the conditions satisfying both the growth rate and the V/III ratio prescribed in the present invention, an MOCVD method is suitable. In particular, an MOCVD method using a trialkylborane compound as the boron (B) source can be suitably used (refer to Inst. Phys. Conf. Ser., No. 129). According to the MOCVD method using triethylborane (($C_2H_5$)$_3$B), in particular, from trialkylborane compounds, the formation of an amorphous BP layer or BP-base mixed crystal layer at a low temperature or the formation of a single crystal layer at a high temperature can be readily and simply performed. Trimethylborane (($CH_3$)$_3$B) is a gas at ordinary temperatures similar to borane or diborane, and its suitability for the formation of a BP layer or a BP-based mixed crystal at a low temperature is not as high as triethylborane. For the formation of a BP layer or a BP crystal layer at a low temperature, an organic boron compound having a low boiling point and which is liquid at ordinary temperatures is suitably used as the boron (B) source.

Figure 2:
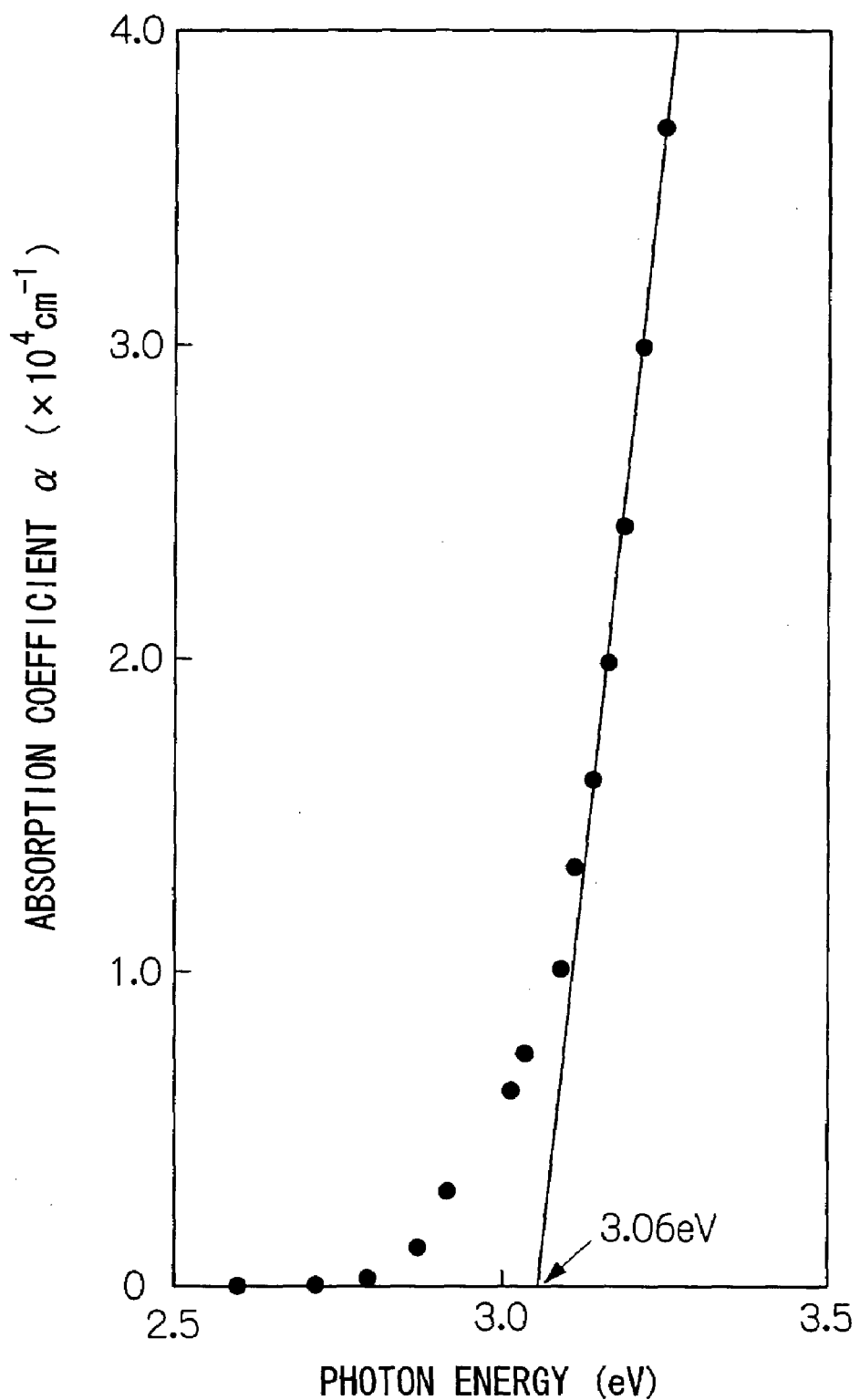
FIG. 2 is a graph showing the photon energy dependency of the absorption coefficient of the BP semiconductor layer according to the present invention.

For example, during the formation of a boron phosphide (BP) single crystal layer using an MOCVD reaction system of triethylborane/phosphine/hydrogen, the growth temperature is preferably from 850 to 1,150° C., more preferably from 900 to 1,100° C., and even more preferably from 950 to 1,050° C. For example, if the V/III ratio at 950° C. is set to 30, a boron phosphide (BP) single crystal layer having a band gap of about 2.9 eV can be stably obtained. The band gap (=Eg) can be determined, for example, by a general photo-luminescence (PL) method or a cathode luminescence (CL) method or from the relationship between the absorption coefficient and the photon energy (refer to Seeger, Semikondakuta no Butsurigaku (Ge) (Physics of Semiconductors (Final Volume)), pages 390 to 400). FIG. 2 shows the photon energy dependence of the absorption coefficient of an undoped BP layer formed under the above-described conditions on the surface of a p-type Si single crystal substrate having a (111) plane by adding boron (B). The band gap at room temperature determined from the relationship between the absorption coefficient ($\alpha$: $cm^{-1}$) and the photon energy (hv: eV) is about 3.1 eV. Incidentally, in the case of a BP crystal, the rate of change of the band gap with respect to the temperature (temperature coefficient) is known to be $-4.5 \times 10^{-4}$ eV per unit absolute temperature (refer to Z. anorg. allg. chem., 349 (1967)). The minus sign in this temperature coefficient means that as the temperature decreases, the band gap increases. Accordingly, the band gap of the BP layer, for example, at a liquid nitrogen temperature (=77 K) is about 3.2 eV. By setting the growth rate and the V/III ratio to respective ranges prescribed in the present invention, the BP layer of the present invention can be obtained.

Figure 3:
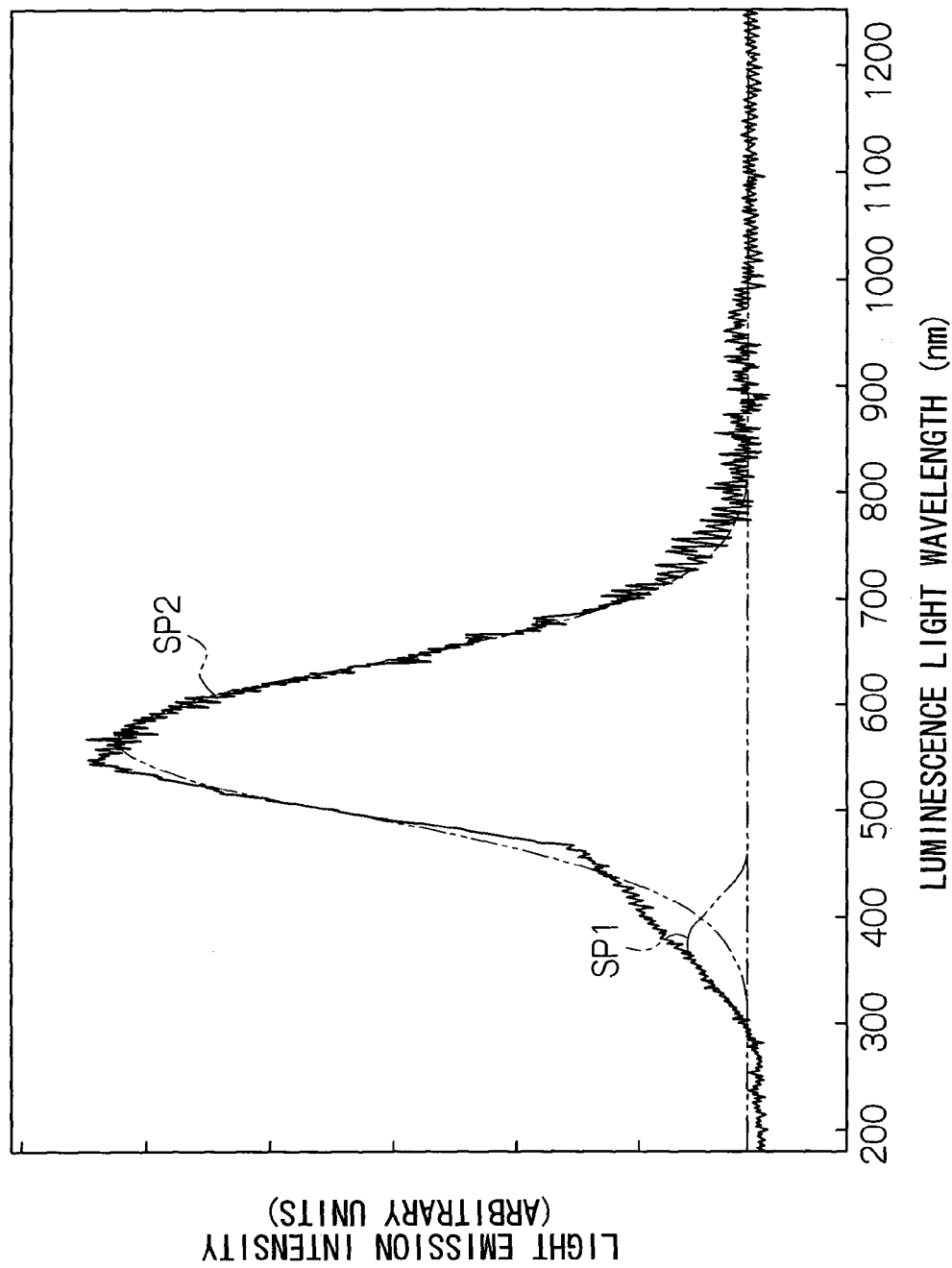
FIG. 3 is a cathode luminescence (CL) spectrum of the BP semiconductor layer according to the present invention.

FIG. 3 shows a CL spectrum of a magnesium (Mg)-doped p-type boron phosphide (BP) layer grown using the same MOCVD reaction system as above by setting the temperature to 950° C., the growth rate to 10 nm/min, and the V/III ratio to 60. The spectrum is measured at a temperature of 30 K. Since boron phosphide (BP) is an indirect semiconductor, the CL spectrum is suitably obtained at a temperature of 77 K or lower. The carrier concentration of the p-type BP layer as a sample is about $8 \times 10^{18}$ $cm^{-3}$. The layer thickness is about 2.2 μm. According to an analysis using a general peak separation method, the components of the CL spectrum shown in FIG. 3 are the spectrum (shown by "SP1" in FIG. 3) having a peak wavelength of about 378.5 nm, and the spectrum (shown by "SP2") having a peak wavelength of about 569.6 nm. "SP2" seems to be a spectrum attributable to the "deep" impurity level. The spectrum shown by "SP2" is characterized in that the reduction of the light emission intensity over time is recognized. On the other hand, "SP1" is a spectrum which is presumed to be a band edge absorption, and from the peak wavelength thereof (378.5 nm), a band gap of about 3.2 eV is calculated.

By taking the case of an undoped BP layer grown by the MOCVD method using a triethylborane (($C_2H_5$)$_3$B)/phosphine ($PH_3$)/hydrogen ($H_2$) system as one example, the amorphous layer generally has a larger band gap. In particular, the room temperature band gap of a BP amorphous layer having therein a distortion attributable to the lattice mismatch with the underlying layer sometimes becomes as large as approximately 3.0 to 3.4 eV. The band gap of a BP polycrystalline layer grown by increasing the growth rate is generally tends to be small. In particular, the band gap of a thick layer having a layer thickness in excess of about 2 to 3 μm sometimes decreases to about 2.8 to 3.0 eV at room temperature, for example. The single crystal BP layer grown under the conditions of a growth rate and a V/III ratio respectively in the above-described preferred ranges can have a medium band gap between the amorphous layer and the polycrystalline layer.

When boron phosphide (BP) having the band gap specified in the present invention is used, a BP-base mixed crystal having a conventionally unknown band gap, represented by the formula: $B_\alpha Al_\beta Ga_\gamma In_{1-\alpha-\beta-\gamma} P_\delta As_\epsilon N_{1-\delta-\epsilon}$ ($0<\alpha\leq 1$, $0\leq\beta<1$, $0\leq\gamma<1$, $0<\alpha+\beta+\gamma\leq 1$, $0<\delta\leq 1$, $0\leq\epsilon<1$, $0<\delta+\epsilon\leq 1$) can be formed. For example, when boron phosphide (BP) having a band gap of not less than 2.8 eV and not more than 3.4 eV according to the present invention is used, a boron phosphide arsenide mixed crystal ($BP_\delta As_\epsilon$: $0<\delta<1$, $0<\epsilon<1$, $\delta+\epsilon=1$) having a band gap of more than about 1.5 eV to less than 3.4 eV at room temperature can be formed. If a conventional BP crystal having a band gap of about 2.0 eV is used, only a $BP_\delta As_\epsilon$ mixed crystal ($0<\delta<1$, $0<\epsilon<1$, $\delta+\epsilon=1$) having a band gap in a narrow range of over about 1.5 eV as band gap of boron arsenide (BAs) (refer to III-V Zoku Kagobutsu Handotai (Group III-V Compound Semiconductors), supra, page 150) to about 2.0 eV as the band gap of boron phosphide (BP) can be formed.

Also, for example, when boron phosphide (BP) having a band gap of not less than 2.8 eV and not more than 3.4 eV according to the present invention is used, a boron gallium phosphide mixed crystal ($B_X Ga_{1-X}P$: $0<X<1$) having a band gap of over 2.3 eV to less than 3.4 eV at room temperature can be formed. The band gap of gallium phosphide (GaP) at room temperature is 2.3 eV (refer to Handotai Debaisu Gairon (Outline of semiconductor Devices), page 28) and, therefore, when the mixed crystal ratio of BP is increased by the formation of a mixed crystal with BP, that is, when the boron composition ratio (=X) is increased, a $B_X Ga_{1-X}P$ ($0<X<1$) mixed crystal having a band gap of 2.3 eV or more can be formed. Incidentally, if a $B_X Ga_{1-X}P$ ($0<X<1$) mixed crystal is formed using a conventional BP having a band gap of about 2.0 eV, only a $B_X Ga_{1-X}P$ ($0<X<1$) mixed crystal having a band gap in a narrow range of about 2.0 to 2.3 eV can be formed. From the BP-base mixed crystal which does not contain arsenic (As) as a constituent element, such as a $B_X Ga_{1-X}P$ ($0<X<1$) mixed crystal, a boron phosphide semiconductor device which is prevented from causing environmental pollution can be advantageously constructed.

As in the above-described case, the BP-base mixed crystal composed of the BP crystal having a band gap of not less than 2.8 eV and not more than 3.4 eV of the present invention has a high band gap over a wide range not seen in conventional BP-base mixed crystals. By virtue of this, the BP-base mixed crystal is particularly useful, for example, in constructing a barrier layer for a light-emitting layer provided for emitting short wavelength light. For example, a clad layer for a light-emitting layer composed of a cubic gallium indium nitride mixed crystal ($Ga_{0.75}In_{0.25}N$) can be constructed from a $B_{0.90}Al_{0.10}P$ mixed crystal having a boron composition ratio (=X) of 0.90. A boron phosphide (BP) or BP-base mixed crystal is a zinc blende-type crystal and due to its valence band structure (refer to Kagobutsu Handotai no Kiso Bussei Nyumon (Basic Physical Properties of Compound Semiconductors, Elementary)), a p-type layer can be readily obtained. Accordingly, for example, unlike a hexagonal gallium nitride (h-GaN), a p-type clad layer having a low resistance can be readily formed. The cubic $Ga_{0.75}In_{0.25}N$ light-emitting layer emits near ultraviolet light of bluish violet color having a light emission wavelength of 443 nm, and therefore, a pn junction-type light-emitting part having a single or double heterojunction structure and giving blue band light emission can be advantageously constructed from a heterojunction structure comprising the $B_{0.90}Al_{0.10}P$ mixed crystal and the $Ga_{0.75}In_{0.25}N$ mixed crystal. The $B_{0.90}Al_{0.10}P$ mixed crystal and the $Ga_{0.75}In_{0.25}N$ have the same lattice constant (=0.4628 nm) (the lattice constant of cubic indium nitride (InN) is calculated as 0.498 nm; refer to III-V Zoku Kagobutsu Handotai (Group III-V Compound Semiconductors), page 330). In other words, since a clad layer lattice-matched to a light-emitting layer can be constructed from BP-base mixed crystals of the present invention, a light-emitting part of the lattice-matched system can be constructed. Crystal layers lattice-matched to each other can be high-quality crystal layer which have fewer crystal defects attributable to the lattice mismatch. Therefore, high-intensity light is emitted from the light-emitting part of the lattice-matched system, and this can contribute to the fabrication of a high-luminescence boron phosphide-base semiconductor light-emitting device. The crystal layers lattice-matched to each other as used herein mean crystal layers in a relationship such that the degree of lattice mismatch is ±0.4% or less.

Also, use of the boron phosphide (BP) layer or BP-base mixed crystal layer of the present invention is advantageous for constructing a light-emitting part of a lattice-matched system suitable for the fabrication of an LED or LD. For example, a pn junction-type light-emitting part of a lattice-matched system can be constructed from a clad layer composed of n-type or p-type boron phosphide (BP) (BP: lattice constant=0.4538 nm) and a light-emitting layer composed of gallium nitride phosphide ($GaN_{0.97}P_{0.03}$: lattice constant=0.4538 nm) having a phosphorus (P) composition ratio of 0.03. Also, a light-emitting part of a lattice-matched system can be readily constructed from a light-emitting layer composed of cubic $GaN_{0.90}P_{0.10}$ having a phosphorus composition ratio of 0.10, and a clad layer composed of cubic boron gallium phosphide ($B_{0.93}Ga_{0.07}P$) having a gallium (Ga) composition ratio of 0.07. Similarly, a light-emitting part of a lattice-matched-system can also be constructed by using gallium nitride arsenide ($GaN_{1-x}As_x$: 0=X=1) as a light-emitting layer. However, under standard conditions, the energy generated by gallium nitride (GaN) is (−)26.2 kcal/mol, and the energy generated of GaAs is larger (−)19.2 kcal/mol (refer to JP-A-10-53487). On the other hand, the energy generated by GaP is (−)29.2 kcal/mol and is smaller than that of GaN (refer to, JP-A-10-53487). Therefore, the $GaN_{1-x}P_x$ mixed crystal can be more readily formed than the $GaN_{1-x}As_x$ mixed crystal, and this is advantageous. A clad layer for the $GaN_{1-x}P_x$ light-emitting layer is constructed from a BP layer or BP-base mixed crystal layer having a larger band gap at room temperature. A clad layer capable of satisfactorily exerting a barrier effect on the light-emitting layer can be constructed from a BP layer or BP-base mixed crystal layer having a band gap which is larger by about 0.1 eV or more, most preferably 0.3 eV or more.

The boron phosphide (BP) or BP-base mixed crystal according to the present invention has a large band gap capable of transmitting visible light of a short wavelength as described above. Therefore, for example, from $B_xGa_{1-x}P$ having a boron composition ratio (=X) adjusted to give a band gap of 2.7 eV or more (when a BP crystal having a room temperature band gap of 3.0 eV is used, $0.4 \leq X < 1$), an emitted light transmitting (window) layer of an LED having a light emission wavelength longer than about 459 nm can be suitably constructed. A boron indium phosphide mixed crystal ($B_xIn_{1-x}P$) having a band gap of over 2.8 eV to less than 3.4 eV can be used in constructing a window layer of an LED or surface emission-type LD capable of transmitting emitted light having a wavelength longer than about 443 nm (refer to Iga and Koyama, Menhakko Reza (Surface Emitting Laser), 1st Ed., 1st printing, pages 4 to 5, Ohmusha (Sep. 25, 1990)), and also can be used in constructing a reflecting mirror for use in an LED or a surface emitting laser (refer to Menhakko Reza (Surface Emitting Laser), pages 118 to 119).

A photodetecting part for use in a photodetecting device can be constructed from a stacked layer structure composed of a $GaN_{1-x}P_x$ mixed crystal which can be more readily produced, and the BP layer or BP-base mixed crystal layer of the present invention. For example, a junction structure of a boron phosphide (BP) layer or BP-base mixed crystal layer with a semiconductor layer having a degree of lattice mismatch of ±0.4% or less to the BP layer or BP-base mixed crystal layer can constitute a photodetecting part for use in a photodetecting device which has a large signal/noise strength ratio, so-called S/N ratio, and an excellent photodetecting sensitivity. In particular, when a photodetecting part is used which comprises a heterojunction structure of a boron phosphide (BP) layer and a semiconductor layer lattice-matched thereto, for example, the $GaN_{1-x}P_x$ layer described above, a photodetecting part for use in a high-sensitivity photodetecting device having a low dark current and an excellent photodetecting sensitivity can be constructed. Also, the BP layer or BP-base mixed crystal layer of the present invention is useful as a light-transmitting layer capable of effectively introducing light to be measured into the photodetecting layer. In particular, the BP layer or BP-based mixed crystal layer having a conventionally unknown, relatively high band gap in excess of 2.8 eV can efficiently transmit even visible light at a short wavelength, such as blue light, and therefore, can be effectively used, for example, as a window layer of a photodetecting device where visible light at a short wavelength is the object to be measured.

A heterojunction structure comprising a boron phosphide (BP) layer or BP-base mixed crystal layer and a semiconductor layer lattice-matched thereto is advantageous in that a carrier, for example, an electron can be transported at a high speed. For example, a heterojunction structure of the BP layer or BP-base mixed crystal layer with a $GaN_{1-x}P_x$ mixed crystal is suitable for constructing a functional layer of a TEGFET where high-speed transportation of electrons are necessary. In this case, a direct transition-type $GaN_{1-X}P_X$ mixed crystal layer can realize high electron mobility and, therefore, is suitable particularly for constructing an electron channel layer of a TEGFET. Also, from the BP layer or BP-base mixed crystal layer, an electron supply layer making a heterojunction with an electron channel layer and playing a role of supplying an electron into the inside of the electron channel layer can be constructed. Furthermore, from the BP layer or BP-based mixed crystal layer of the present invention, a spacer layer which may be disposed between the electron supply layer and the electron channel layer can also be constructed. The electron supply layer or the spacer layer is suitably constructed from a semiconductor layer represented by the formula $B_\alpha Al_\beta Ga_\gamma In_{1-\alpha-\beta-\gamma} P_\delta As_\epsilon N_{1-\delta-\epsilon}$ ($0<\alpha\leq 1$, $0\leq\beta<1$, $0\leq\gamma<1$, $0<\alpha+\beta+\gamma\leq 1$, $0<\delta\leq 1$, $0\leq\epsilon<1$, $0<\delta+\epsilon\leq 1$), having a band gap which is larger than that of the constituent material of the electron channel layer, by 0.2 eV or more, preferably about 0.3 eV or more. Particularly, for the reasons described above, a $GaN_{1-X}P_X$ mixed crystal layer is easy to form as compared with an arsenic compound.

When the bowing of band gap by the phosphorus (P) composition ratio of a $GaN_{1-X}P_X$ mixed crystal is utilized (refer to Appl. Phys. Lett., 60 (20), pages 2540 to 2542 (1992)), the band gap can be varied by changing the phosphorus (P) composition by about several percent in the region of direct transition. For example, if the phosphorus (P) composition ratio is set to 5%, the band gap can be reduced from 3.2 eV to about 2.8 eV. If the phosphorus (P) composition ratio is set to 10%, the band gap can be reduced to about 2.0 eV. That is, the $GaN_{1-X}P_X$ mixed crystal is advantageous in that an electron channel layer can be readily constructed therefrom which channel layer can exhibit, in correspondence to the phosphorus (P) composition ratio, the above-described suitable difference in the band gap from the spacer layer or electron supply layer comprising a BP layer or BP-base mixed crystal layer.

Figure 4:
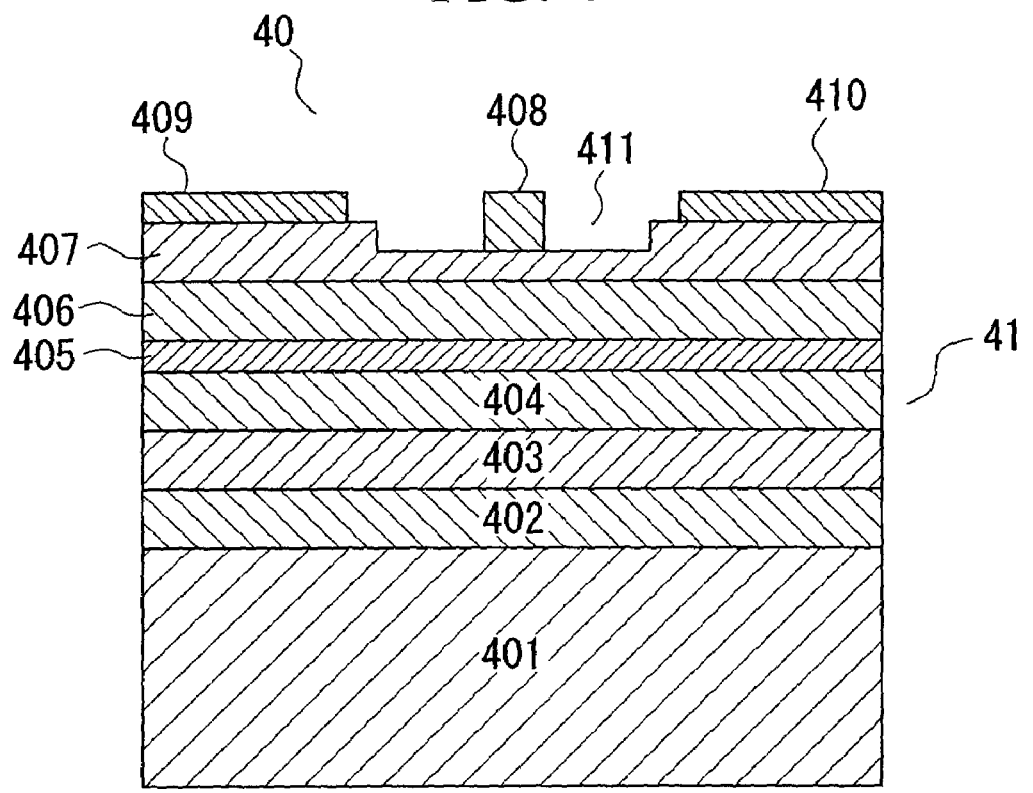
FIG. 4 is a schematic sectional view of a TEGFET constructed using the BP layer according to the present invention.

As schematically shown in FIG. 4, a stacked layer structure 41 for use in a TEGFET 40 is formed by sequentially stacking, for example, the following layers on a substrate 401 comprising sapphire having a plane direction of (0001) (c face):

(1) a low-temperature buffer layer 402 composed of, for example, undoped high-resistance boron aluminum phosphide ($B_X Al_{1-X} P$: $0<X<1$) having a layer thickness (=d) of about 10 nm, with the major part being amorphous, which has a band gap within the range from not less than 2.8 eV to not more than 3.4 eV, preferably of 3 eV or more;

(2) a high-temperature buffer layer 403 composed of, for example, undoped n-type BP having a carrier concentration (=n) of less than about $5\times 10^{15}$ cm$^{-3}$ and d=300 nm, which is formed at a higher temperature than the low-temperature buffer layer 402 and preferably has a band gap of 3 eV or more;

(3) an electron channel layer 404 composed of, for example, cubic undoped n-type $GaN_{0.97}P_{0.03}$ (for example, n=$5\times 10^{16}$ cm$^{-3}$, d=25 nm), which is lattice-matched to BP constituting the high-temperature buffer layer 402 and has a lower band gap;

(4) a spacer layer 405 composed of, for example, undoped n-type BP having a carrier concentration (=n) of less than about $5\times 10^{15}$ cm$^{-3}$ and d=5 nm, which has a band gap higher than that of the electron channel layer 404 and preferably has a band gap of 3 eV or more;

(5) an electron supply layer 406 composed of, for example, silicon (Si)-doped n-type BP having a carrier concentration (=n) of about $2\times 10^{18}$ cm$^{-3}$ and d=25 nm, which preferably has a band gap of 3 eV or more; and (6) an ohmic electrode contact layer 407 composed of, for example, silicon (Si)-doped n-type BP having a carrier concentration (=n) of about $5\times 10^{18}$ cm$^{-3}$ and d=15 nm, which preferably has a band gap lower than that of the electron supply layer 406.

Subsequently, a part of the contact layer 407 is recessed, and in the recessed part, a Schottky junction-type gate electrode 408 is provided. On the surface of the contact layer 407 remaining in both sides of the recessed part 411, an ohmic source electrode 409 and a drain electrode 410 are formed to construct the TEGFET 40.

For example, a $GaN_{1-X}P_X$ mixed crystal layer stacked on the boron phosphide (BP) or BP-base mixed crystal can be used as a magnetic induction part of a Hall device. Particularly, for example, a $GaN_{1-X}P_X$ mixed crystal layer, which is not an indirect transition type but a direct transition type, can be used as a magnetic sensing layer of a Hall device. Depending on the phosphorus composition ratio, the $GaN_{1-X}P_X$ mixed crystal layer can have a larger band gap than any one of indium antimonide (InSb, band gap=0.18 eV), indium arsenide (InAs, band gap=0.36 eV) and gallium arsenide (GaAs, band gap=1.43 eV) (with respect to the value of the band gap at room temperature; refer to III-V Zoku Kagobutsu Handotai (Group III-V Compound Semiconductors), page 150) each constituting a magnetic sensing layer of conventional Hall devices (refer to Appl. Phys. Lett., 60 (1992)). A semiconductor material having a large band gap is advantageous for constructing a Hall device capable of working at high temperatures because the temperature reaching the intrinsic region of the electrical conductivity is higher (refer to Semikondakuta no Butsurigaku (Jo) (Physics of Semiconductors (First Volume)), pages 5 to 10). For example, a $GaN_{1-X}P_X$ mixed crystal capable of having a band gap higher than that of a $GaN_{1-X}As_X$ mixed crystal layer can constitute a magnetic sensing layer of which enables operation of the device at a higher temperature. Accordingly, a heterojunction structure comprising a $GaN_{1-X}P_X$ mixed crystal layer and a BP layer or BP-base mixed crystal layer is advantageous in that an environment-resistant Hall device capable of acting even at high temperatures can be constructed. Particularly, the direct transition-type n-type $GaN_{1-X}P_X$ mixed crystal layer lattice-matched to the BP layer or BP-base mixed crystal layer can realize a more improved electron mobility and, therefore, can contribute to the production of an environment-resistant Hall device having high sensitivity and which is capable of acting at high temperatures.

Figure 5:
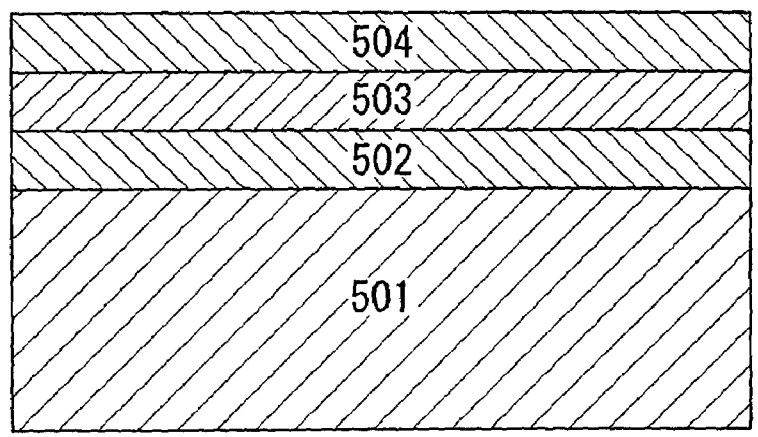
FIG. 5 is a schematic sectional view of a stacked layer structure for use in a Hall device, constructed using the BP semiconductor layer according to the present invention.

The Hall device according to the present invention is constructed from a substrate and a stacked layer structure containing, for example, a buffer layer and a magnetic sensing layer. FIG. 5 is a cross-sectional view showing an example of the stacked layer structure for use in an environment-resistant Hall device according to the present invention. For the substrate 501, a single crystal such as silicon, sapphire or silicon carbide (SiC) is used. The first buffer layer 502 provided on the single crystal semiconductor 501 is constructed from, for example, an amorphous n-type BP layer grown at a low temperature. The second buffer layer 503 is constructed from, for example, a silicon (Si)-doped n-type BP single crystal layer grown at a temperature higher than the first buffer layer 502. The magnetic sensing layer 504 is composed of, for example, gallium nitride (GaN) (melting point of hexagonal h-GaN: >1,700° C. (refer to Handotai Debaisu Gairon (Outline of semiconductor Devices), page 28)) having a high melting point similarly to boron phosphide (BP) (melting point=3,000° C. (refer to Handotai Debaisu Gairon (Outline of semiconductor Devices), page 28), or gallium nitride phosphide (GaN$_{1-X}$P$_X$: 0<X<1). The magnetic sensing layer 504 is suitably composed of a material less lattice-mismatched or even lattice-matched to the underlying layer (the second buffer layer 503 in the stacked layer structure system of FIG. 5). The absolute value (Δ: unit is %) of the lattice mismatch can be calculated from the lattice constant (=a$_0$) of the underlying layer and the lattice constant (=a) of the deposited layer according to the following formula:

$$\Delta(\%)=|(a-a_0)/a_0|\times 100$$

The lattice mismatch between the cubic GaN (a=0.4510 nm) and the BP single crystal (a$_0$=0.4538 nm) is only 0.6%, and cubic GaN is one suitable material for constituting the magnetic sensing layer. The buffer layer (first layer 502 of FIG. 5), with the major part being amorphous in the as-grown state described in this construction example, has an action of relaxing the lattice mismatch and contributes to the further improvement of the crystallinity of the upper layer.

The lattice constant of GaNP having a nitrogen composition ratio of 0.03 is 0.4538 nm, and this is in agreement with the lattice constant of the BP single crystal. The magnetic sensing layer composed of such a lattice-matched material gives a high-quality crystal layer reduced in the density of crystal defects such as misfit dislocation attributable to the lattice mismatch. Accordingly, a higher electron mobility can be realized and, in turn, a high-sensitivity Hall device having excellent heat resistance can be provided. On the surface of a phosphorus (P)-doped n-type Si single crystal substrate 501 having a plane direction of (100), the following growth layers are sequentially stacked, for example, by an atmospheric pressure MOCVD method using a triethylborane (($C_2H_5$)$_3$B)/phosphine (PH$_3$)/ammonia (NH$_3$)/hydrogen (H$_2$) system:

(1) a first buffer layer 502 comprising an undoped n-type BP layer having a layer thickness (=d) of about 7 nm and a band gap of about 3.1 eV at room temperature;

(2) a second buffer layer 503 (d=0.7 μm) comprising an n-type BP layer having a carrier concentration (=n) of about 6×10$^{15}$ cm$^{-3}$ and a band gap of about 3.0 eV at room temperature; and (3) a magnetic sensing layer 504 comprising cubic n-type GaN$_{0.97}$P$_{0.03}$ having d=0.1 μm, n=2×10$^{16}$ cm$^{-3}$, and an electron mobility of about 850 cm$^2$/V·s at room temperature.

Subsequently, the magnetic sensing layer 504 is subjected to a mesa formation process by plasma etching using a methane (CH$_4$)/argon (Ar)/hydrogen (H$_2$) system. At the four edge parts of the magnetic sensing layer 504 which remain, having a cross shape, as a magnetic sensing part (Hall cross part), an ohmic electrode comprising, for example, gold (Au) or an Au alloy is provided. From such a construction, an environment-resistant high-sensitivity Hall device having a product sensitivity of about 1.5 mV/mA·T at room temperature is provided.

The boron phosphide (BP) according to the present invention has a large band gap in excess of the band gap of conventional techniques and, therefore, a BP-base mixed crystal having a conventionally unknown large band gap can be constructed from the BP of the present invention. Accordingly, the degree of freedom in constructing a heterojunction structure with other semiconductor layers having a different band gap can be expanded, and various heterojunction structures can be realized. For example, a conventional BP having a small band gap (band gap: 2 eV) cannot construct a heterojunction structure capable of exerting a barrier effect on GaN$_{0.97}$P$_{0.03}$ (band gap: 3 eV) lattice-matched to the BP.

On the other hand, from the BP according to the present invention, in particular, BP having a band gap in excess of 3 eV, a barrier layer for GaN$_{0.97}$P$_{0.03}$ can be formed and, therefore, a lattice-matched heterojunction structure capable of exerting a carrier "confinement" effect can be constructed. As described above, such a heterojunction structure is effective in obtaining an environment-resistant heterojunction device such as a TEGFET and Hall device. In a TEGFET, when BP or a BP-base mixed crystal having a large band gap according to the present invention is used as the buffer layer, the leakage of gate current can be particularly prevented and, therefore, a TEGFET having excellent transconductance (gm) can be produced. In a Hall device, when the buffer layer is composed of the BP or BP-base mixed crystal having a large band gap specified in the present invention, the leakage of operating current can be prevented and this provides an effect of providing a Hall device which has high product sensitivity.

The semiconductor layer composed of the BP or BP-base mixed crystal specified in the present invention can realize a larger band gap than in conventional techniques, so that a heterojunction structure having a conventionally unknown large band-offset can be created with various semiconductor layers. The heterojunction structure using a semiconductor layer composed of the BP or BP-base mixed crystal specified in the present invention is a heterojunction structure having a large band discontinuity as described above and therefore, can be advantageously used as a barrier layer, in particular.

EXAMPLES

Example 1

Figure 6:
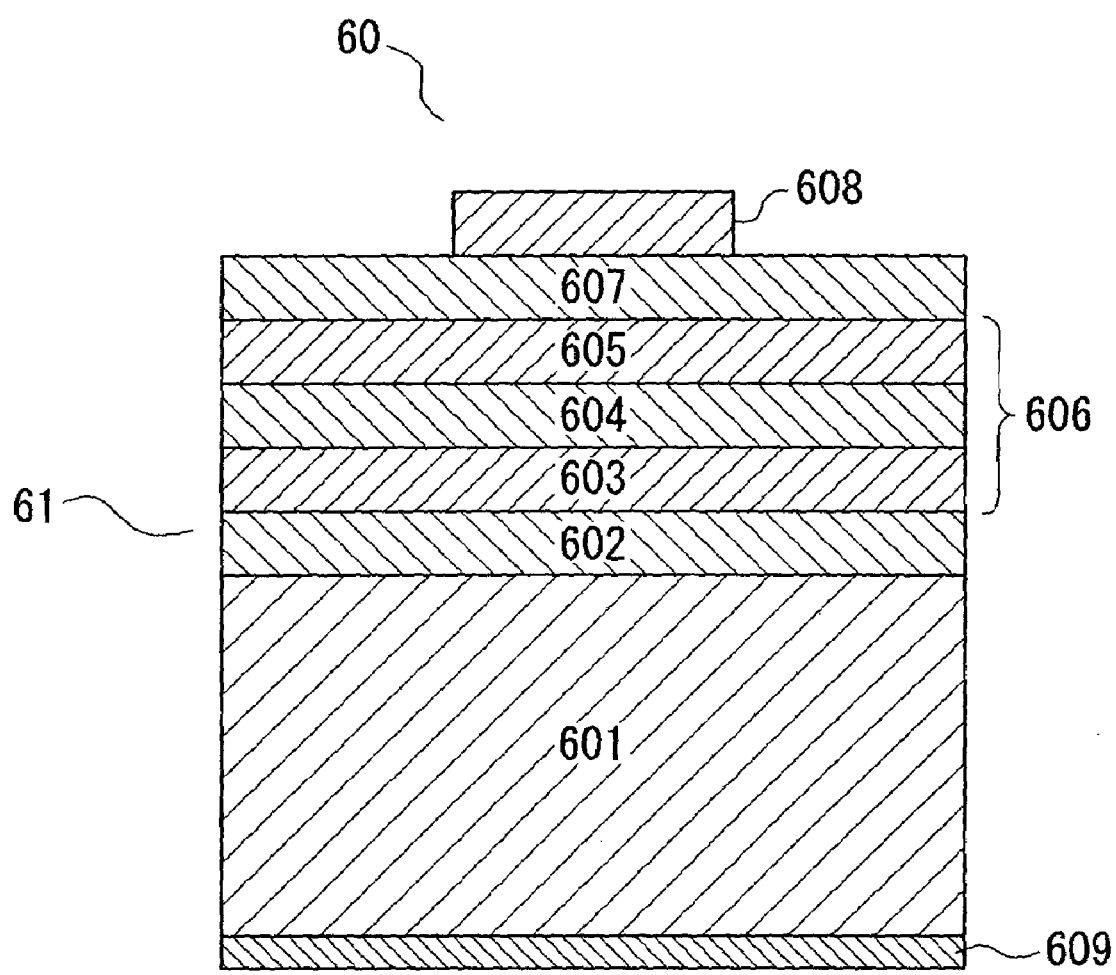
FIG. 6 is a schematic sectional view of a pn junction type LED according to Example 1 of the present invention.

In Example 1, the present invention is described in detail by referring to a Group III nitride semiconductor LED using the BP semiconductor layer of the present invention. FIG. 6 schematically shows a cross sectional structure of the pn junction type LED 60 of Example 1.

The stacked layer structure 61 for use in LED 60 was constructed using a boron (B)-doped p-type Si single crystal having a (111) plane as the substrate 601. The low-temperature buffer layer 602 on the substrate 601 was composed of boron phosphide (BP) with the main part being amorphous in the as-grown state. The low-temperature buffer layer 602 was grown at 350° C. by an atmospheric pressure MOCVD method using a triethylborane (($C_2H_5$)$_3$B)/phosphine (PH$_3$)/hydrogen (H$_2$) system. The layer thickness of the low-temperature buffer layer 602 was about 12 nm.

Using the above-described MOCVD vapor phase growth method, a magnesium-doped p-type BP layer was stacked at 950° C. as a lower clad layer 603 on the surface of the low-temperature buffer layer 602. The magnesium doping source used was bis-cyclopentadienyl magnesium (bis-($C_5H_5$)$_2$Mg). The carrier concentration of the lower clad layer 603 was about 7×10$^{18}$ cm$^{-3}$ and the layer thickness was about 0.8 μm.

Figure 7:
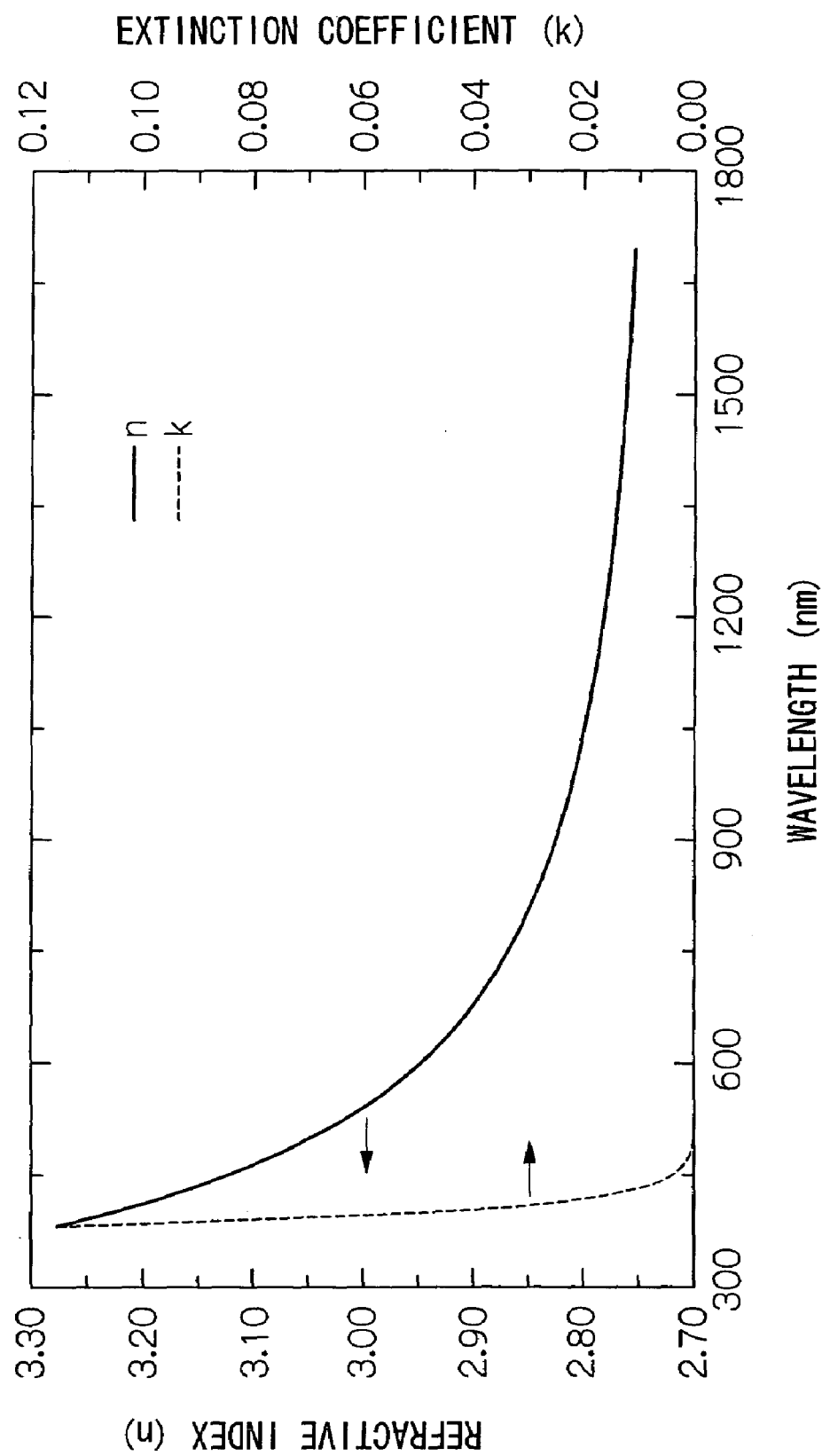
FIG. 7 is a graph showing the wavelength dependency of the refractive index and the extinction coefficient of the BP layer according to Example 1 of the present invention.
Figure 8:
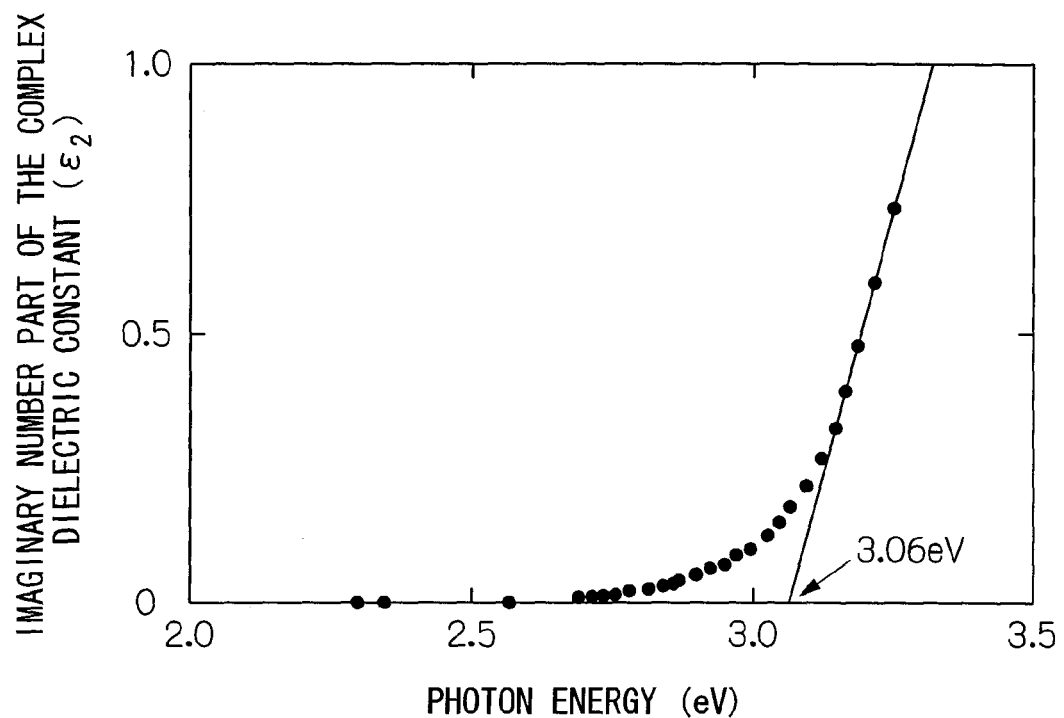
FIG. 8 is a graph showing the relationship between the imaginary number part of the dielectric constant and the photon energy of the BP layer according to Example 1 of the present invention.

FIG. 7 shows the wavelength dependency of the refractive index and the extinction coefficient at room temperature of the BP layer constituting the lower clad layer 603. The extinction coefficient (=k) tends to abruptly increase in the shorter wavelength side to more than about 450 nm and also, the refractive index (=n) tends to increase even more in the shorter wavelength side. For example, the refractive index and the extinction coefficient at a wavelength of 450 nm are about 3.12 and about 0.0029, respectively, whereas at a wavelength of 380 nm, α=3.28 with k=0.1120. FIG. 8 shows the relationship between the imaginary number part of the complex dielectric constant ($\epsilon_2=2\cdot n\cdot k$) determined based on the values of n and k (refer to III-V Zoku Kagobutsu Handotai (Group III-V Compound Semiconductors), pages 168 to 171) and on the photon energy. As the photon energy decreases, the $\epsilon_2$ value decreases. The photon energy determined from the intercept of $\epsilon_2$ values was about 3.1 eV. This reveals that the room temperature band gap of the boron phosphide (BP) crystal constituting the lower clad layer 603 is about 3.1 eV.

On the BP lower clad layer 603 having a room temperature band gap of about 3.1 eV, a magnesium-doped p-type gallium nitride phosphide ($GaN_{0.97}P_{0.03}$) layer having a phosphorus (P) composition ratio of 0.03 and which lattice-matches the boron phosphide (BP) was stacked as the light-emitting layer 604. The difference in the band gap between the BP constituting the lower clad layer 603 and the light-emitting layer (room temperature band gap: 2.9 eV) comprising $GaN_{0.97}P_{0.03}$ was about 0.2 eV. The light-emitting layer 604 comprising cubic $GaN_{0.97}P_{0.03}$ was grown at 950° C. by an atmospheric pressure MOCVD method using a trimethylgallium (($CH_3)_3Ga$)/$PH_3$/$H_2$ system. The carrier concentration of the light-emitting layer 604 was about $3\times10^{17}$ cm$^{-3}$ and the layer thickness was about 0.3 μm.

On the light-emitting layer 604, n-type boron phosphide (BP) having a layer thickness of about 0.3 μm was stacked as the upper clad layer 605. The upper clad layer 605 was grown at 950° C. by an atmospheric pressure MOCVD method using a ($C_2H_5)_3B$/$PH_3$/$H_2$ system. The lattice constant of the light-emitting layer 605 was 0.4538 nm and the lattice constant of the upper clad layer 605 was in agreement with the lattice constant of the light-emitting layer 604. The upper clad layer 605 was composed of a BP crystal having a room temperature band gap of about 3.1 eV, similar to the lower clad layer 603. The carrier concentration of the upper clad layer 605 was about $2\times10^{18}$ cm$^{-3}$. A light-emitting part 606 of a pn junction-type double hetero (DH) junction structure was constructed from the lower clad layer 603, the upper clad layer 605, each comprising a BP semiconductor layer having a band gap of about 3.1 eV, and the $GaN_{0.97}P_{0.03}$ light-emitting layer 604.

On the upper clad layer 605, a current diffusion layer 607 comprising n-type BP having a band gap of about 3.1 eV was stacked. The Si-doped BP layer constituting the current diffusion layer 607 was grown at 950° C. by an atmospheric pressure MOCVD method using a ($C_2H_5)_3B$/$PH_3$/$H_2$ system. The layer thickness of the current diffusion layer 607 was about 50 nm and the carrier concentration was about $8\times10^{18}$ cm$^{-3}$.

On the back surface of the p-type Si single crystal substrate 601, a p-type ohmic electrode 609 comprising aluminum (Al) was formed. At the center on the surface of the current diffusion layer 607, an n-type ohmic electrode 608 comprising an Au.Ge alloy was disposed. The diameter of the n-type ohmic electrode 608 was about 130 μm. Thereafter, the Si single crystal as the substrate 601 was cut in the directions parallel and perpendicular to the [211] direction to form an LED chip 60 having a side length of about 300 μm.

A forward driving current was passed between both ohmic electrodes 608 and 609 to emit light. The current-voltage characteristics (I-V characteristics) exhibited normal rectification characteristics based on a good pn junction property of the light-emitting part 606. The forward voltage (so-called $V_f$) calculated from the I-V characteristics was about 3.1 V (forward current=20 mA). The reverse voltage was about 10 V (reverse current=5 μA). On passing a forward operating current of 20 mA, blue light having a center wavelength of about 430 nm was emitted. The half band-width of the emission spectrum was about 23 nm. The light emission intensity in a chip state measured using a general integrating sphere was about 14 microwatts (μW). Thus, a BP-base compound semiconductor LED having high light emission intensity was provided.

Example 2

Figure 9:
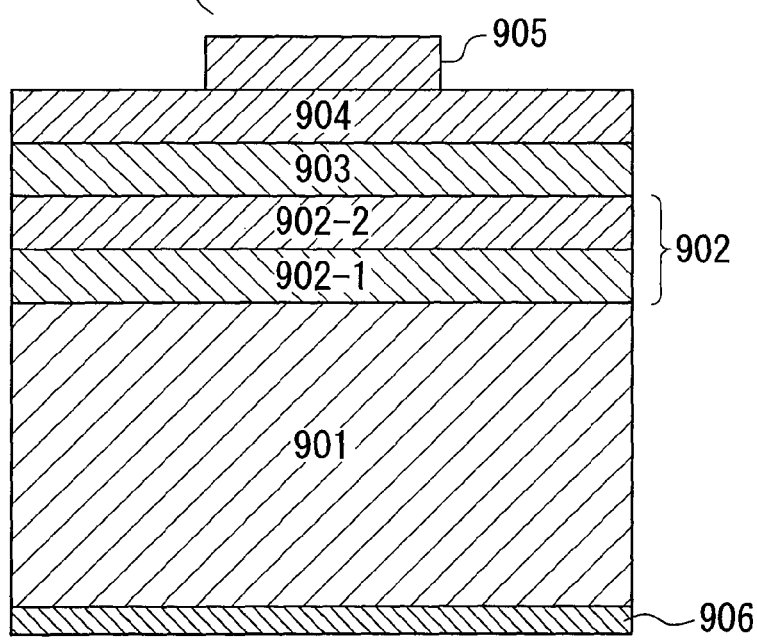
FIG. 9 is a schematic sectional view of a pn junction type diode according to Example 2 of the present invention.

In Example 2, the present invention is described in detail by referring to a pn junction-type diode having the boron phosphide (BP) layer specified in the present invention. FIG. 9 schematically shows a cross sectional structure of the pn junction-type diode 90 of Example 2.

On a phosphorus (P)-doped n-type Si single crystal substrate 901 having a (111) plane, a low-temperature crystal layer 902-1 composed of boron gallium phosphide ($B_XGa_{1-X}P$) was stacked at 400° C. by a reduced pressure MOCVD method using a diborane ($B_2H_6$)/($CH_3)_3Ga$/$H_2$ system. The boron (B) composition ratio (=X) was set to 0.02 so as to attain lattice-matching to the Si single crystal (lattice constant=0.5431 nm). The low-temperature crystal layer 902-1 was grown under reduced pressure of about $1.3\times10^4$ pascals (Pa). The layer thickness of the low-temperature crystal layer 902-1 was about 4 nm.

When observed by a sectional TEM method, in the $B_{0.02}Ga_{0.98}P$ low-temperature crystal layer 902-1 in the as-grown state, the upper region, from the junction surface with the Si single crystal substrate 901 to about 1 nm, changed to a single crystal. Between the $B_{0.02}Ga_{0.98}P$ low-temperature crystal layer 902-1 and the n-type Si single crystal substrate 901, no peeling was observed and good adhesion was maintained. The upper part of the low-temperature crystal layer 902-1 was mainly composed of an amorphous material.

On the $B_{0.02}Ga_{0.98}P$ low-temperature crystal layer 902-1, an Si-doped n-type $B_XGa_{1-X}P$ high-temperature crystal layer 902-2, where a compositional gradient was imparted to the boron composition (=X), was stacked at 950° C. using the above-described reduced pressure MOCVD reaction system. The boron (B) composition ratio was linearly increased from 0.02 to 1.0 in the direction of increasing thickness of the high-temperature crystal layer 902-2. Namely, by imparting a gradient to the boron (B) composition, the surface of the n-type high-temperature crystal layer 902-2 was made to be a boron phosphide (BP) layer. This n-type $B_XGa_{1-X}P$ layer which was imparted with a compositional gradient (X=0.02→1.0) was a crystal layer having a band gap of nearly 3.0 eV because the layer was constructed based on a BP crystal having a band gap of about 3.0 eV at room temperature. The compositional gradient of boron (B) was imparted by uniformly increasing the amount of diborane supplied to the MOCVD reaction system over time and by uniformly decreasing the amount of trimethylgallium supplied. The layer thickness was about 0.4 μm. During the growth of the n-type high-temperature crystal layer 902-2, the pressure in the reaction system was set to about $1.3\times10^4$ Pa. During the growth of the high-temperature $B_XGa_{1-X}P$ crystal layer 902-2 having a gradient in the boron composition (X=0.02→1.0), Si was doped using a disilane ($Si_2H_6$)—$H_2$ mixed gas. The carrier concentration was set to about $1\times10^{18}$ cm$^{-3}$. According to the X-ray diffraction analysis, the n-type high-temperature crystal layer 902-2 was confirmed to be a cubic $B_XGa_{1-X}P$ (X=0.02→1.0) crystal layer having a (111) orientation.

After the completion of layer formation of the $B^xGa_{1-x}P$ compositional gradient layer as the n-type high-temperature crystal layer 902-2, the majority of the amorphous material inside the $B_{0.02}G_{0.98}P$ low-temperature crystal layer 902-1 changed into a single crystal due to the single crystal layer present in the boundary region with the Si single crystal substrate 901 in the as-grown state. Also, since the n-type $B_XGa_{1-X}P$ (X=0.02→0.1) high-temperature crystal layer 902-2 was provided on the low-temperature crystal layer 901-1 comprising $B_{0.02}Ga_{0.98}P$ (lattice constant=0.5431 nm) having a composition lattice-matched to the Si single crystal substrate 901, a continuous layer which does not separate was formed. The buffer layer 902 was constructed from a double layer structure of the above-described low-temperature crystal layer 902-1 and high-temperature crystal layer 902-2.

On the n-type high-temperature crystal layer 902-2, an n-type boron phosphide (BP) layer 903 was joined by a reduced pressure MOCVD method using a $B_2H_6/PH_3/H_2$ system. During the growth of the n-type BP layer 903, Si was doped using an $Si_2H_6$—$H_2$ mixed gas. The carrier concentration of the n-type BP layer 903 was about $5\times10^{17}$ cm$^{-3}$ and the layer thickness was about 0.3 µm. The n-type layer 903 was composed of a BP crystal having a band gap of about 3.0 eV at room temperature.

On the n-type BP layer 903, a p-type BP layer 904 was stacked at 950° C. by a reduced pressure MOCVD method using a $B_2H_6/PH_3/H_2$ system. The p-type BP layer 904 was constructed from a magnesium (Mg)-doped BP layer having a band gap of about 3.0 eV. The Mg doping source used was bis-cyclopentadienyl Mg (bis-$(C_5H_5)_2$Mg). Although the p-type layer 904 was a wide band gap semiconductor, since the layer was composed of BP as a zinc blende crystal and had a low ionic bonding property, the carrier concentration could be made to about $3\times10^{18}$ cm$^{-3}$. The layer thickness of the p-type layer 904 was about 0.2 µm. A pn junction structure was constructed from the above-described n-type BP layer 903 and n-type BP layer 904.

On the back surface of the n-type Si single crystal substrate 901, an n-type ohmic electrode 906 comprising aluminum (Al) was formed. At the center on the surface of the p-type BP layer 904, a p-type ohmic electrode 905 comprising gold (Au) was disposed. The diameter of the p-type ohmic electrode 905 was about 110 µm. Thereafter, the Si single crystal as the substrate 901 was cut in the directions parallel and perpendicular to the [211] direction to form a diode 90 chip having a side length of about 350 µm.

Figure 10:
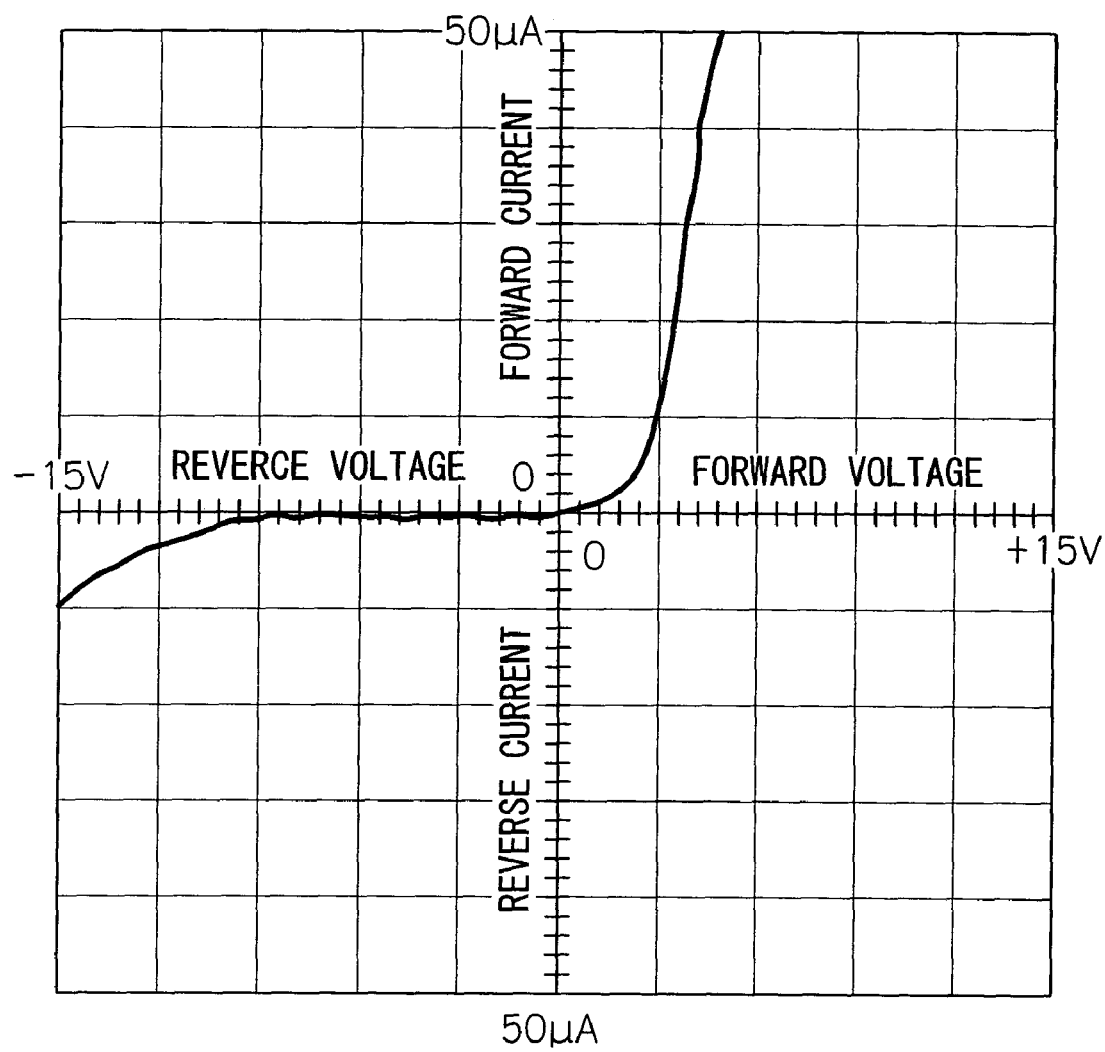
FIG. 10 is a graph showing the current-voltage characteristics of the pn junction-type diode according to Example 2 of the present invention.

A forward current was passed between both ohmic electrodes 905 and 906 and measured. FIG. 10 shows the current-voltage characteristics (I-V characteristics). The pn junction-type BP diode of Example 2 exhibited normal rectification characteristics due to a good pn junction property. The reverse voltage was about 15 V (reverse current=10 µA). Thus, a compound semiconductor pn junction-type diode having a high breakdown voltage was provided.

Example 3

Figure 11:
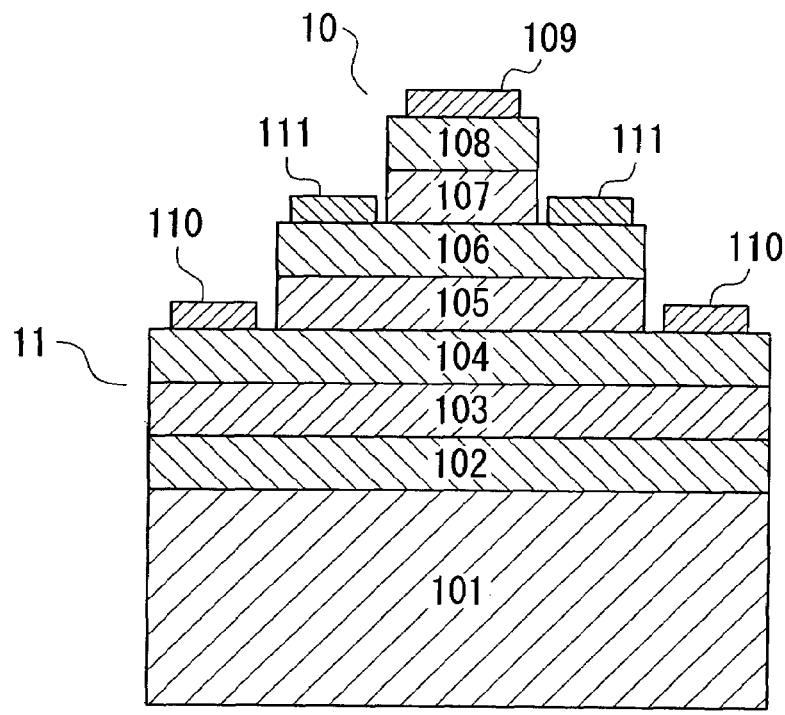
FIG. 11 is a schematic sectional view showing the structure of an npn junction-type HBT according to Example 3 of the present invention.

In Example 3, the present invention is described in detail by referring to an npn junction-type hetero bipolar transistor (HBT) having the BP-base mixed crystal containing boron phosphide (BP) of the present invention. FIG. 11 is a schematic sectional view of the npn junction-type HBT 10 of Example 3.

On a phosphorus (P)-doped n-type Si single crystal substrate 101 having a (100) plane, a low-temperature buffer layer 102 composed of boron gallium phosphide ($B_XGa_{1-X}$P) was stacked at 350° C. by a reduced pressure MOCVD method using a diborane $(B_2H_6)/(CH_3)_3Ga/H_2$ system. The boron (B) composition ratio (=X) was set to 0.02 so as to attain lattice-matching to the Si single crystal (lattice constant=0.5431 nm). The low-temperature buffer layer 102 was grown under a reduced pressure of about $1.3\times10^4$ pascals (Pa). The layer thickness of the low-temperature buffer layer 102 was about 14 nm.

On the $B_{0.02}Ga_{0.98}P$ low-temperature buffer layer 102, respective functional layers shown below were stacked in sequence by fixing the growth temperature at 850° C., using the above-described reduced pressure MOCVD reaction system. By setting the carrier concentration (n (n-type) or p (p-type)) and the layer thickness (t) of each of the function layers 103 to 108 as shown below, a stacked layer structure 11 for use in HBT 10 was constructed.

(1) A collector layer 103 (n=$9\times10^7$ cm$^{-3}$, t=0.50 µm) comprising an Si-doped n-type $B_XGa_{1-X}P$ compositional gradient layer with the surface being boron phosphide (BP), where the boron composition ratio (=X) was linearly increased from 0.02 to 1.0 toward the layer surface from the junction interface with the BP low-temperature buffer layer 102.

(2) A sub-collector layer 104 composed of Si-doped n-type BP, where n=$2\times10^{18}$ cm$^{-3}$ and t=0.10 µm.

(3) An intermediate layer 105 composed of cubic Si-doped n-type gallium nitride (GaN), where n=$3\times10^{18}$ cm$^{-3}$ and t=0.05 µm.

(4) A base layer 106 composed of magnesium (Mg)-doped p-type boron phosphide nitride ($BP_{0.97}N_{0.03}$) having a band gap of about 3 eV at room temperature, where p=$3\times10^{19}$ cm$^{-3}$ and t=0.01 µm.

(5) An emitter layer 107 composed of Si-doped n-type gallium nitride (GaN) having a band gap of about 3.2 eV at room temperature, where n=$4\times10^{18}$ cm$^{-3}$ and t=0.20 µm.

(6) A contact layer 108 composed of Si-doped n-type gallium nitride (GaN) having a band gap of about 3.2 eV at room temperature, where n=$7\times10^{18}$ cm$^{-3}$ and t=0.10 µm.

Thereafter, the stacked layer structure 11 for the HBT was stepwise-etched by a general plasma etching means using an argon (Ar)/methane $(CH_4)$/hydrogen $(H_2)$ mixed gas to expose the surface of each functional layer of the contact layer 108, the base layer 106 and the sub-collector layer 104. The above-described intermediate layer 105 was able to inhibit the etching of the sub-collector layer 104 and, therefore, provided an effect of clearly exposing the surface of the sub-collector layer 104.

On the surface of the contact layer 108, an emitter electrode 109 comprising a gold-germanium alloy (Au: 97 wt %, Ge: 3 wt %) was disposed. The emitter electrode 109 had a square plane shape with a side length of about 110 µm. On the sub-collector layer 104 exposed by etching, a collector electrode 110 similarly comprising an Au.Ge alloy was disposed. Respective electrodes 109 and 110 for an n-type layer, which were fixed by a general vacuum evaporation means, were then heat-treated for alloying at 420° C. for 5 minutes. Thereafter, on the p-type base layer 106, a stripe-like base electrode 111 comprising a gold-zinc alloy (Au: 95 wt %, Zn: 5 wt %) was disposed by selective patterning using a known photolithography technique. Then, the base electrode 111 was heat-treated for alloying at 400° C. for 2 minutes. Subsequently, cutting into individual semiconductor devices was performed.

While applying a voltage of 2.5 V (so-called collector voltage) between the emitter electrode 109 and the collector electrode 110 of the obtained HBT, the base current of the base layer 106 having a sheet resistance of about 360 Ω/square was varied in the range from 0 to 50 microamperes (µA). The DC amplification factor ($\beta=I_{CE}/V_B$) was almost constant with respect to the variation of the base current, and was about 95. Thus, according to the present invention, an HBT having a high and stable DC amplification factor is provided.

Example 4

Figure 12:
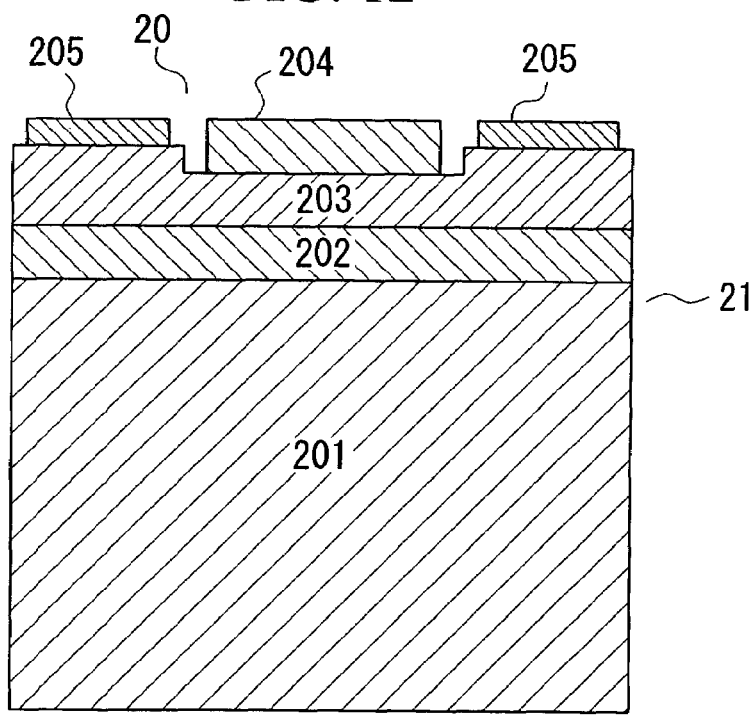
FIG. 12 is a schematic sectional view of a photodetecting device according to Example 3 of the present invention.

In Example 4, the present invention is described in detail by referring to a photodetecting device (photodetector) used for the ultraviolet band, having the boron phosphide (BP) semiconductor layer specified in the present invention. FIG. 12 is a schematic sectional view showing the construction of the photodetecting device 20 of Example 4.

On a (0001) (c face) sapphire substrate 201, a low-temperature buffer layer 202 composed of boron phosphide (BP) was deposited at 380° C. by an atmospheric pressure (almost atmospheric pressure) MOCVD method using a triethylborane $(C_2H_5)_3B/PH_3/H_2$ system. The layer thickness of the low-temperature buffer layer 202 was about 5 nm. On the BP low-temperature buffer layer 202, a silicon (Si)-doped n-type boron phosphide (BP) active layer 203 was stacked at 825° C. using the above-described ordinary pressure MOCVD means to construct a stacked layer structure 21 for use in the photodetecting device 20. The active layer 203 was composed of a BP semiconductor layer having a band gap of about 3.1 eV at room temperature. The carrier concentration of the active layer 203 was about $2\times10^{17}$ cm$^{-3}$ and the layer thickness was about 1.8 µm.

This stacked layer structure 21 for the photodetecting device was subjected to plasma etching to circularly etch the center part on the surface of the active layer 203. The etching was carried out on a circular region having a diameter of about 120 µm and the etching depth was about 0.1 µm. In this region, a Schottky electrode 204 having a diameter of about 100 µm and comprising a three-layer structure of titanium (Ti)/platinum (Pt)/gold (Au) was formed. In the outer periphery of the Schottky electrode 204, an annular ohmic electrode 205 comprising a three-layer structure of a gold-germanium alloy (Au.Ge)/nickel (Ni)/gold (Au) was disposed to construct the photodetecting device 20. The annular electrode 205 was formed on the circumference centered at the center of the Schottky electrode 204 and had a diameter of about 220 µm.

In Example 4, the BP active layer 203 was stacked using the low-temperature buffer layer 202 as an underlying layer and, therefore, the active layer 203 became a good quality crystal layer. As a result, the dark current at the time of applying a reverse voltage of −2 V between the ohmic electrode 205 and the Schottky electrode 204 was reduced to about $1\times10^{-8}$ A/cm$^2$. The cut-off wavelength was about 400 nm. Thus, according to the present invention, a near ultraviolet band photodetecting device having an excellent dark current property was provided.

INDUSTRIAL APPLICABILITY

According to the present invention, a compound semiconductor device is constructed using boron phosphide (BP) having a conventionally unknown large band gap of not less than 2.8 eV and not more than 3.4 eV at room temperature or a BP-base mixed crystal obtained by forming a mixed crystal with the BP crystal, so that a semiconductor device capable of acting at high temperatures by virtue of the wide band gap and, moreover, having a high breakdown voltage can be constructed. In particular, since a zinc blende crystal-type BP or BP-base mixed crystal having a small ionic bonding property despite its wide band gap is used, a p-type conductive layer having a high hole concentration can be simply and readily formed, so that a semiconductor device using a low-resistance p-type semiconductor layer as a functional layer can be readily and simply provided.

From the pn junction-type diode using a semiconductor layer comprising BP or a semiconductor layer comprising a BP-base mixed crystal of the present invention, a diode exhibiting normal rectification characteristics and having a high breakdown voltage is obtained. From an LED using a semiconductor layer comprising BP or a semiconductor layer comprising a BP-base mixed crystal of the present invention, a blue light-emitting device having a high light emission intensity is obtained. From the photodetecting device using a semiconductor layer comprising BP or a semiconductor layer comprising a BP-base mixed crystal of the present invention, a photodetecting device having an excellent dark current property and suitable for use in the near ultraviolet band is obtained.

From a TEGFET using a semiconductor layer comprising BP or a semiconductor layer comprising a BP-base mixed crystal of the present invention, a field effect transistor capable of realizing high electron mobility can be obtained. From an HBT using a semiconductor layer comprising BP or a semiconductor layer comprising a BP-base mixed crystal of the present invention, an HBT having a high and stable DC amplification factor is obtained. From a Hall device using a semiconductor layer comprising BP or a semiconductor layer comprising a BP-base mixed crystal of the present invention, a Hall device having excellent heat resistance and high sensitivity is obtained.

According to the method of the present invention for forming a BP or BP-base mixed crystal layer having a wide band gap, a boron phosphide (BP) or BP-base mixed crystal having a high band gap of not less than 2.8 eV and not more than 3.4 eV at room temperature, which has not been seen in conventional techniques, can be stably formed. This provides an effect of enabling the formation of various heterojunction structures with other semiconductors. For example, from BP having a band gap specified in the present invention, a heterojunction structure which excerts a barrier effect on gallium nitride phosphide (GaNP mixed crystal), which cannot be constructed from conventional BP having a band gap of about 2 eV, can be constructed.

Furthermore, according to the method for forming a BP or BP-base mixed crystal layer of the present invention, even in the case where a stacked layer structure for obtaining a compound semiconductor device is constructed on a lattice-mismatching single crystal as the substrate material, a buffer layer composed of a BP or BP-base mixed crystal, which can relax the mismatch between the substrate material and the constituent layer of the stacked layer structure, can be constructed. On the buffer layer capable of relaxing the lattice mismatch, a BP layer or BP-base mixed crystal layer having excellent crystallinity can be formed. Therefore, according to the formation method of the present invention, a stacked layer structure comprising a BP layer or BP-base mixed crystal having excellent crystallinity can be formed and in turn, a compound semiconductor device having excellent properties can be provided.

As described above, the present invention has industrial applicability.

The invention claimed is:

1. A semiconductor layer comprising a boron phosphide-base mixed crystal which contains boron phosphide, the boron phospide component thereof having a band gap of not less than 2.8 eV and not more than 3.4 eV at room temperature and which mixed crystal is represented by the formula:

$B_\alpha Al_\beta Ga_\gamma In_{1-\alpha-\beta-\gamma} P_\delta As_\epsilon N_{1-\delta-\epsilon}$ ($0<\alpha\leq 1$, $0=\beta<1$, $0\leq\gamma<1$, $0<\alpha+\beta+\gamma\leq 1$, $0<\delta=1$, $0\leq\epsilon<1$, $0<\delta+\epsilon\leq 1$), said semiconductor layer being formed by a metallo-organic chemical vapor deposition method (MOCVD method), at a temperature higher than 750° C. and not higher than 1200° C., with a ratio of the total supply amount of Group V element sources including phosphorus (P) to the total supply amount of Group III element sources including boron (B) being not less than 15 and not more than 60 and the growth rate of the semiconductor layer being not less than 2 nm/min, and not more than 30 nm/min.

2. A semiconductor device comprising a crystal substrate and a semiconductor layer according to claim 1, wherein said semiconductor layer is stacked on the crystal substrate.

3. A semiconductor device comprising a substrate, a first semiconductor layer according to claim 1, and a second semiconductor layer having a band gap different from that of said first semiconductor layer, wherein said first semiconductor layer and the second semiconductor layer form a heterojunction.

4. A semiconductor device according to claim 3, wherein said first semiconductor layer and said second semiconductor layer are lattice-matched.

5. A semiconductor device according to claim 2, which has a pn junction structure.

6. A semiconductor device according to claim 3, which has a pn junction structure.

* * * * *

UNITED STATES PATENT AND TRADEMARK OFFICE
CERTIFICATE OF CORRECTION

PATENT NO.       : 7,315,050 B2                                    Page 1 of 2
APPLICATION NO.  : 10/332200
DATED            : January 1, 2008
INVENTOR(S)      : Takashi Udagawa It is certified that error appears in the above-identified patent and that said Letters Patent is hereby corrected as shown below:

Column 1, Line 16, delete " $0 \leqq \beta < 1, 0 \leqq \gamma < 1, 0 < \alpha+\beta+\gamma \leqq 1, 0 < \delta \leqq 1, 0 \leqq \varepsilon < 1, 0 < \delta\varepsilon \leqq 1)$ "

and insert -- $0 \leqq \beta < 1, 0 \leqq \gamma < 1, 0 < \alpha+\beta+\gamma \leqq 1, 0 < \delta \leqq 1, 0 \leqq \varepsilon < 1, 0 < \delta+\varepsilon \leqq 1)$ --

Column 7, Line 37, delete " $0 \leqq \beta < 1, 0 \leqq \gamma < 1, 0 < \alpha+\beta+\gamma \leqq 1, 0 < \delta = 1, 0 \leqq \varepsilon < 1, 0 < \delta+\varepsilon \leqq 1)$ "

and insert -- $0 \leqq \beta < 1, 0 \leqq \gamma < 1, 0 < \alpha+\beta+\gamma \leqq 1, 0 < \delta \leqq 1, 0 \leqq \varepsilon < 1, 0 < \delta+\varepsilon \leqq 1)$ --

Column 8, Line 58, delete " $0 < \alpha \leqq 1, 0 \leqq \beta < 1, 0 \leqq \gamma < 1, 0 < \alpha+\beta+\gamma = 1, 0 < \delta = 1, 0 \leqq \varepsilon < 1$ "

and insert -- $0 < \alpha \leqq 1, 0 \leqq \beta < 1, 0 \leqq \gamma < 1, 0 < \alpha+\beta+\gamma \leqq 1, 0 < \delta \leqq 1, 0 \leqq \varepsilon < 1$ --

Column 29, Line 5, delete " $B_\alpha Al_\beta Ga_\gamma In_{1-\alpha-\beta-\gamma} P_\delta As_\varepsilon N_{1-\delta-\varepsilon} (0 < \alpha \leqq 1, 0 = \beta < 1,$ "

and insert -- $B_\alpha Al_\beta Ga_\gamma In_{1-\alpha-\beta-\gamma} P_\delta As_\varepsilon N_{1-\delta-\varepsilon} (0 < \alpha \leqq 1, 0 \leqq \beta < 1,$ --

UNITED STATES PATENT AND TRADEMARK OFFICE
CERTIFICATE OF CORRECTION

PATENT NO.       : 7,315,050 B2
APPLICATION NO.  : 10/332200
DATED            : January 1, 2008
INVENTOR(S)      : Takashi Udagawa It is certified that error appears in the above-identified patent and that said Letters Patent is hereby corrected as shown below:

Column 29, line 6, delete " $0 \leqq \gamma < 1, 0 < \alpha+\beta+\gamma \leqq 1, 0 < \delta = 1, 0 \leqq \varepsilon < 1, 0 < \delta+\varepsilon \leqq 1)$, said"

and insert -- $0 \leqq \gamma < 1, 0 < \alpha+\beta+\gamma \leqq 1, 0 < \delta \leqq 1, 0 \leqq \varepsilon < 1, 0 < \delta+\varepsilon \leqq 1)$, said--

Signed and Sealed this

Twenty-fourth Day of June, 2008

JON W. DUDAS
*Director of the United States Patent and Trademark Office*